United States Patent [19]
Iizuka et al.

[11] Patent Number: 6,053,398
[45] Date of Patent: *Apr. 25, 2000

[54] SOLDER BUMP FORMING METHOD, SOLDER BUMP FORMING APPARATUS, HEAD UNIT FOR USE THEREIN AND SOLDERING METHOD USING THE HEAD UNIT

[75] Inventors: Shinichiro Iizuka; Satoshi Fukuoka, both of Ichihara; Kenji Suzuki, Chiba, all of Japan

[73] Assignee: The Furukawa Electric Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/982,886

[22] Filed: Dec. 2, 1997

[30] Foreign Application Priority Data

Dec. 6, 1996 [JP] Japan ................................. 8-326854
Feb. 13, 1997 [JP] Japan ................................. 9-028240

[51] Int. Cl.$^7$ .......................... B23K 35/12; B23K 31/12; B05D 5/12
[52] U.S. Cl. ...................... 228/254; 228/103; 228/234.1; 228/246; 427/96
[58] Field of Search ................. 228/248.1, 254, 228/234.1, 207, 221, 223, 180.22, 246; 427/96

[56] References Cited

U.S. PATENT DOCUMENTS 5,565,119 10/1996 Behun et al. ................ 219/121.63
5,653,381 8/1997 Azdasht .
5,834,062 11/1998 Johson et al. ..................... 427/256
5,878,939 3/1999 Luchinger et al. ................ 427/256

FOREIGN PATENT DOCUMENTS

4320055 A1 12/1994 Germany .
2155380 9/1985 United Kingdom .

OTHER PUBLICATIONS

Patent Abstracts of Japan, vol. 096, No. 006, Jun. 28, 1996, & JP 08 031830 A (Oki Electric Ind. Co., Ltd.), Feb. 2, 1996.

*Primary Examiner*—Patrick Ryan
*Assistant Examiner*—Kiley Stoner
*Attorney, Agent, or Firm*—Frishauf, Holtz, Goodman, Langer & Chick, P.C.

[57] ABSTRACT

A solder bump forming method includes a step of causing one end surface of a punch inserted into a through hole provided in a die to be retracted by a desired distance from an end surface of the die to thereby provide a recess of a desired volume in the end surface of the die, a step of embedding solder in the recess of the die, a step of moving the punch toward the end surface of the die to thereby extrude the solder, and a step of fusing the solder extruded by the movement of the punch.

22 Claims, 19 Drawing Sheets

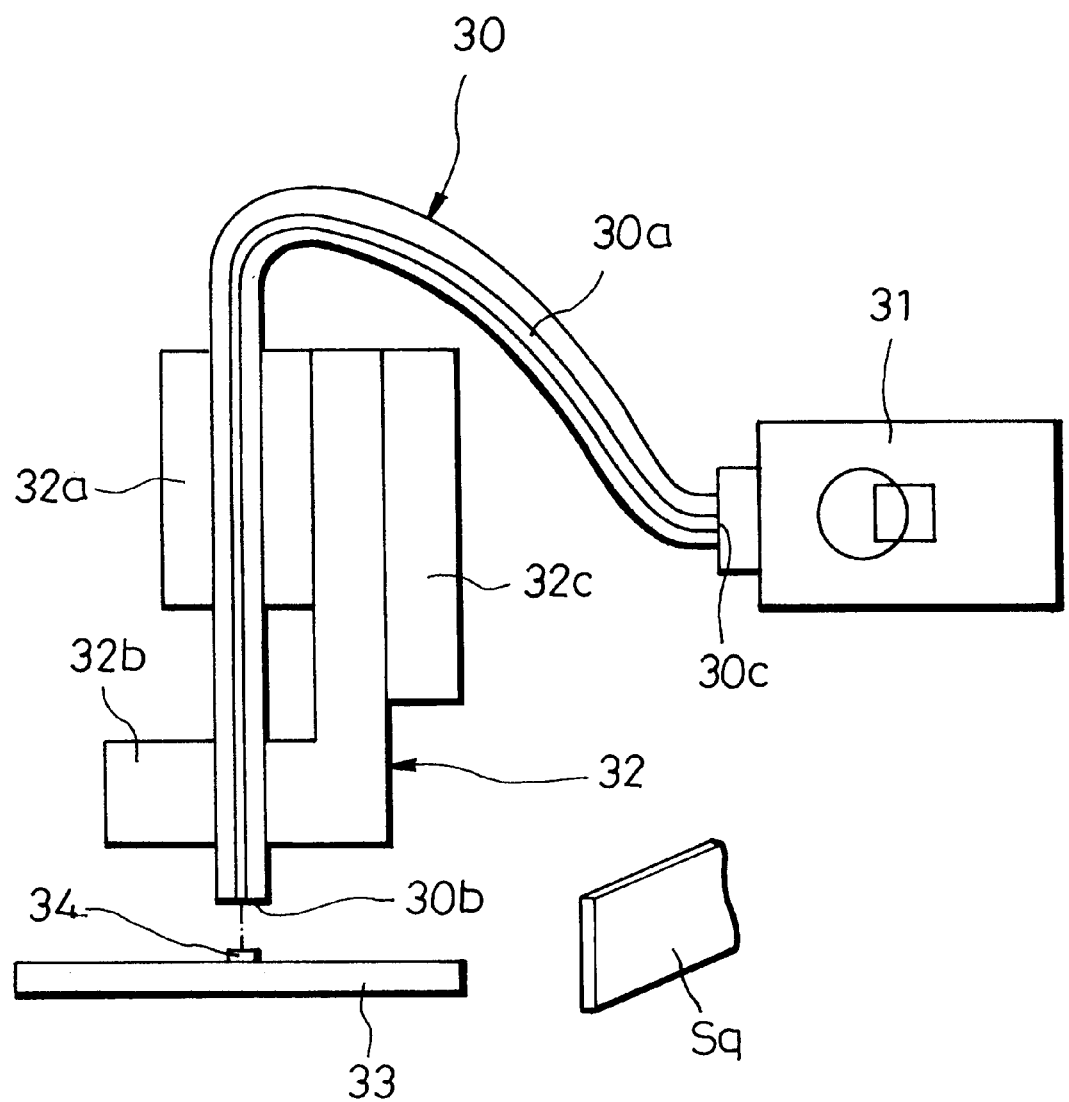

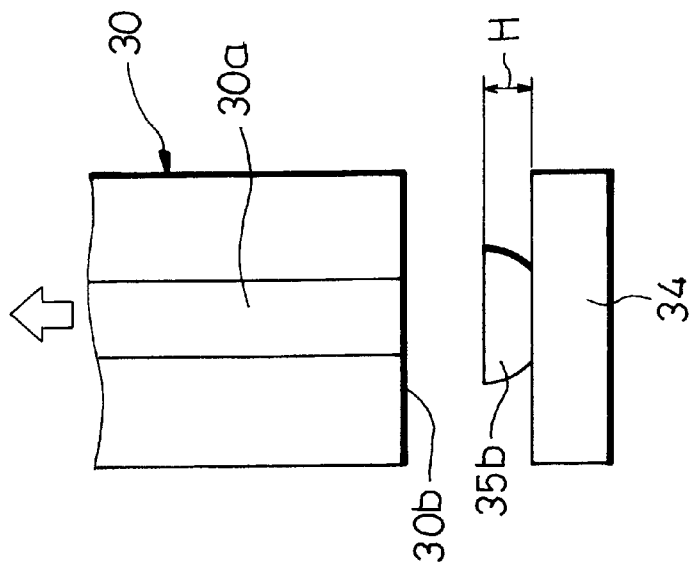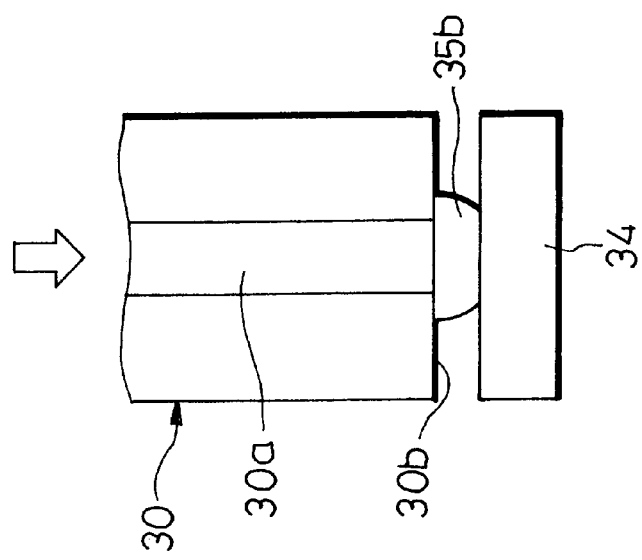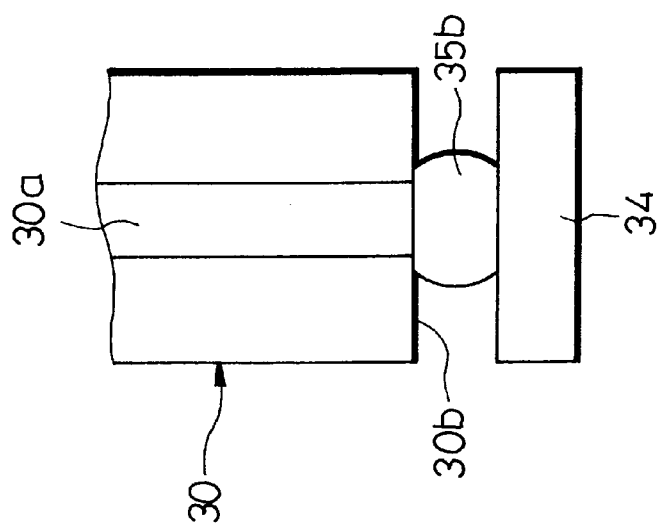

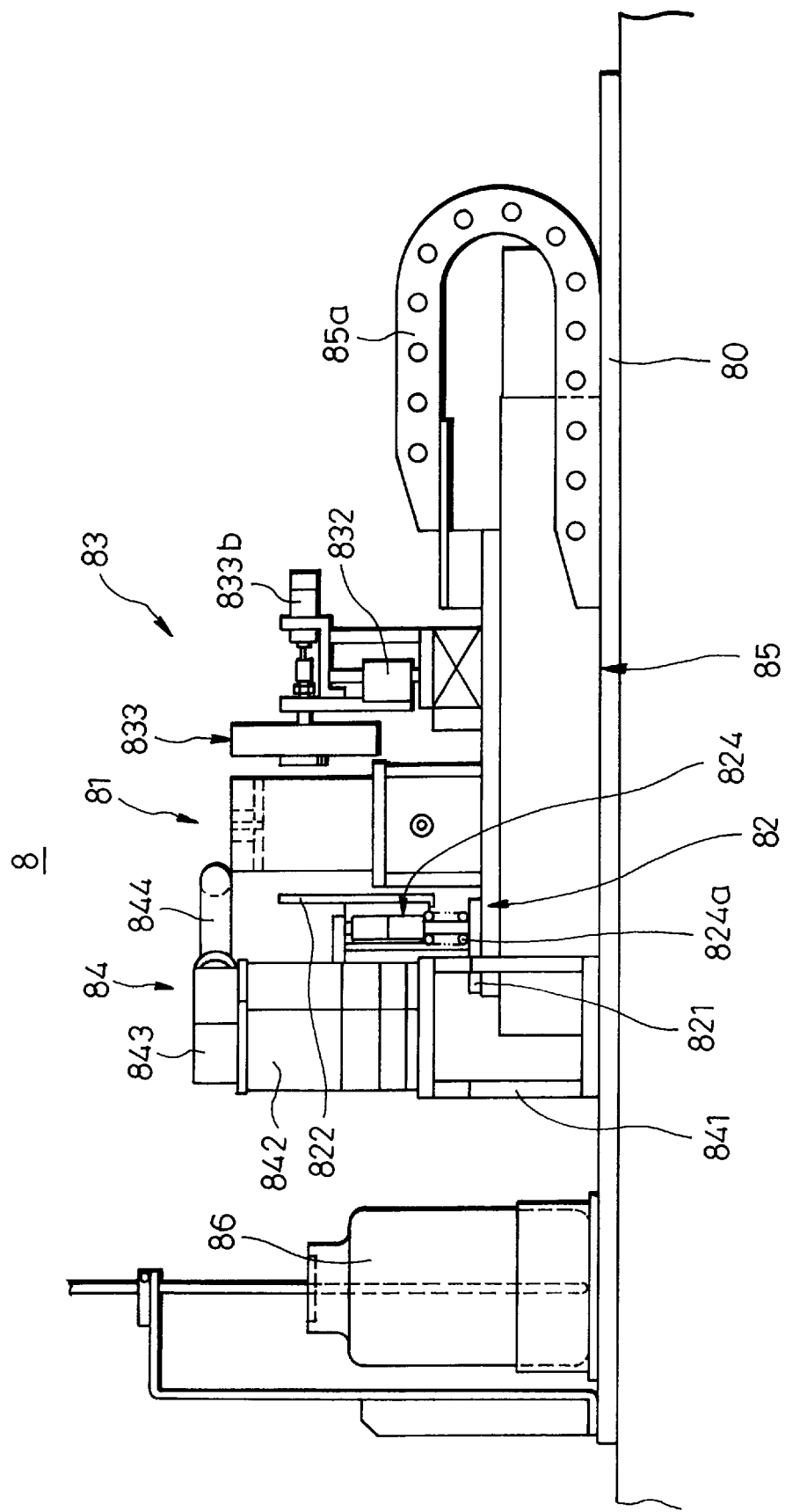

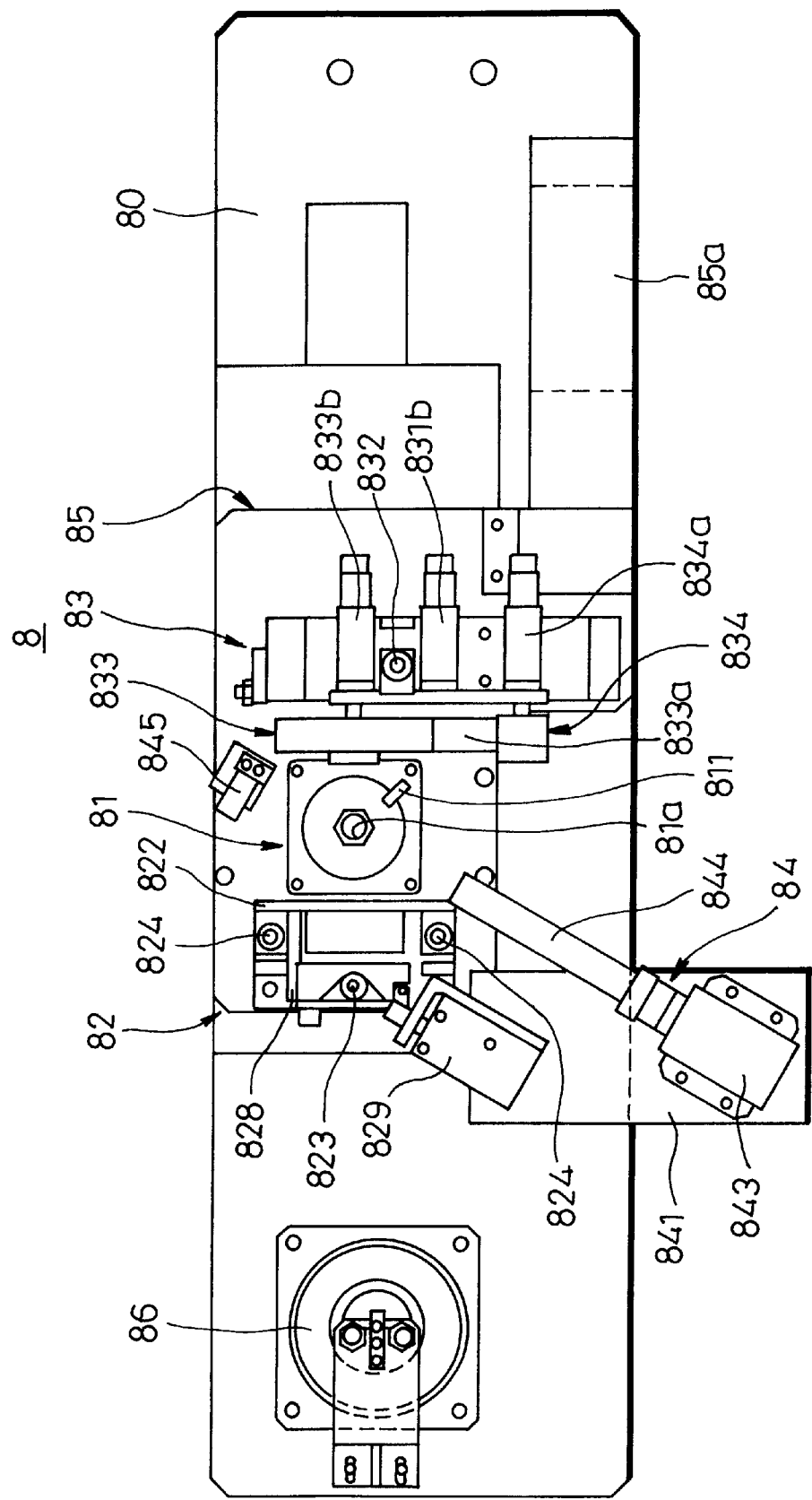

SOLDER BUMP FORMING METHOD, SOLDER BUMP FORMING APPARATUS, HEAD UNIT FOR USE THEREIN AND SOLDERING METHOD USING THE HEAD UNIT

BACKGROUND OF THE INVENTION

1. Field of the Invention

The present invention relates to a method for forming a solder bump used to mount, for example, an IC chip on, for example, a printed circuit board, an apparatus for forming the solder bump, a head unit for use therein and a soldering method using the head unit.

2. Description of the Prior Art

When mounting, for example, an IC chip on a printed circuit board, it is necessary to form a solder bump for causing an electrical contact between the IC chip and the printed circuit board and fixing the IC chip onto the printed circuit board. In recent years, the mounting density on the substrate has increased, the number of the solder bumps has increased, and the disposition pitch between the solder bumps has become narrowed.

Conventionally, as a method for forming a solder bump, for example, solder paste is printed on a board having copper pads formed thereon beforehand and the resulting board is heated and reacted within a reflow furnace. Thereafter, the solder paste on other portions than the copper pads is removed by cleaning, whereby the solder bumps are collectively formed on a large number of the copper pads.

As another method for forming a solder bump, using a heater contained in a solder discharging device made up into a syringe structure, the solder in the cylinder is fused and, while pressure control is carried out by a piston, the thus-fused solder is discharged in a very small amount from a fine opening and adhered onto a copper pad.

As still another method for forming a solder bump, it is known to set a thin film-like solder sheet between a punch of a fine cross section heated by a first heater and a die heated by a second heater, lower the punch and soften the solder sheet to thereby punch it out, and adhere the punched-out solder sheet onto a copper pad using an adhesive flux coated on the copper pad in advance.

However, the conventional solder bump forming methods have the following problems:

1) In the first method, there are cases where it is difficult to adhere a required amount of solder onto the substrate through the execution of only a one-cycle process alone. In these cases, since several cycles of adhering process are repeatedly executed, the productivity becomes deteriorated.

Also, in a case where in this method several solder bumps are defective (the amount of the solder is smaller than a proper amount of solder), when the disposition pitch of the bump is narrow, it is difficult to add a solder paste to only each of these defective solder bumps and print it to thereby increase the amount of the solder adhered and thereby correct it to a proper amount of solder. It is to be noted that although in this case it is possible to prepare a mask for adding a solder paste and printing the same and thereby perform additional printing thereof, this causes an excessive increase in the cost.

2) In the second method, when the discharged fused solder is adhered onto the copper pad, the fused solder is separated within the cylinder and in addition the separated positions vary. Therefore, it is difficult to supply a minute and fixed amount of solder stably.

Also, the copper pad onto which solder is to be adhered, or defective solder bumps which already exist, have their surfaces oxidized and so there are many cases where the fused solder is difficult to adhere onto these surfaces. Accordingly, when adhering solder, there is the troublesomeness of separately coating flux as a reducing agent.

3) In the third method, although the punch of a very small cross section is used, heating a forward end of such punch by thermal transfer from an external heater is inferior in terms of the heat efficiency. For this reason, in the third method, a large-sized heating mechanism must be provided in the vicinity of the punch, with the result that the resulting apparatus becomes one which is difficult to move. Also, there is the problem that heating, softening and punching out the solder by means of the punch are not easy.

Further, when solder, for example, solder paste is adhered onto the copper pad on the substrate, unless solder paste is reliably adhered onto the copper pad, an excellent solder bump cannot be formed. Also, when solder paste is adhered onto the copper pad, there is also the problem that squashing this solder paste excessively by means of a forward end of a member retaining the solder paste causes the solder paste to be severed whereby the formation of an excellent solder bump is obstructed.

SUMMARY OF THE INVENTION

A first object of the present invention is to provide a solder bump forming method and a solder bump forming apparatus which enable a required amount of solder to be adhered onto a substrate at one time, which enable the highly efficient and inexpensive formation of a fine solder bump, and which enable the use thereof also in order to make a proper modification of a solder bump.

A second object of the present invention is to provide a solder bump forming method and a solder bump forming apparatus which in addition to the first object enable the easy movement of the apparatus and enable the provision of an excellent heating efficiency.

A third object of the present invention is to provide a head unit used in a solder bump forming apparatus which when adhering solder onto a desired position of a substrate to thereby form a fine solder bump enables the high precision control of a relative distance between the member retaining the solder and the substrate, as well as a soldering method using this head unit.

The present invention has been made in order to solve the above-described problems and according to a first aspect of the invention there is provided a solder bump forming method for forming a fine solder bump on a substrate which comprises a step of causing one end surface of a punch inserted into a through hole provided in a die to be retracted by a desired distance from an end surface of the die to thereby provide a recess of a desired volume in the end surface of the die, a step of embedding solder in the recess, a step of moving the punch toward the end surface of the die to thereby extrude the solder, and a step of fusing the solder extruded by the movement of the punch.

According to a second aspect of the invention, in the solder fusing step, the solder is fused using a non-contact type heating light source.

According to a third aspect of the invention, the punch is a light waveguide member which introduces the heating light for fusing the solder from the other end surface thereof.

According to a fourth aspect of the invention, there is provided a step of cleaning the punch at the time which is before the step of embedding the solder.

According to a fifth aspect of the invention, there is provided a step of by-rubbing cutting the solder at the end surface of the die in which the solder has been embedded.

According to a sixth aspect of the invention, the heating light is introduced from the other end surface of the light waveguide member and this heating light is radiated onto the solder from the one end surface of the light waveguide member to thereby fuse the solder and thereby form a solder bump on the substrate.

According to a seventh aspect of the invention, using the heating light introduced from the other end surface of the light waveguide member, the solder adhered onto the one end surface of the light waveguide member is fused, after which the fused solder is brought into contact with a desired position of the substrate to thereby form a solder bump on the substrate.

According to an eighth aspect of the invention, the solder adhered onto the one end surface of the light waveguide member is adhered onto a pad of the substrate, after which the heating light is introduced from the other end surface of the light waveguide member.

According to a ninth aspect of the invention, the solder is adhered onto the pad of the substrate and thereafter the light waveguide member is separated from the pad to thereby cause the light waveguide member to be spaced away from the solder adhered onto the pad, after which the heating light is introduced into the light waveguide member.

According to a tenth aspect of the invention, the substrate is pre-heated beforehand.

The invention according to an eleventh aspect is a solder bump forming apparatus for realizing the solder bump forming method of the sixth to tenth aspects, which solder bump forming apparatus comprises a heating light source, a light waveguide member having one end surface onto which solder is adhered and having the other end surface optically coupled to the heating light source, and a guiding mechanism for moving the one end surface of the light waveguide member relatively to the substrate.

The invention according to an twelfth aspect is a solder bump forming apparatus for realizing the solder bump forming method of the first ot fifth aspects, which solder bump forming apparatus comprises a die having a through hole provided therein, a punch having one end surface thereof slidably inserted into the through-hole, means for embedding solder into a recess formed by the through-hole and the punch, means for causing the punch to slide within the through hole of the die to thereby extrude the solder to the end surface of the die, and a heating source for fusing the solder.

According to a thirteenth aspect of the invention, as the heating source there is used a heating light source which is kept out of contact with the solder.

According to a fourteenth aspect of the invention, as the punch there is used a light waveguide member wherein a heating light for fusing the solder is introduced from the other end surface thereof.

The invention according to a fifteenth aspect is a head unit used in the solder bump forming apparatus of the eleventh to fourteenth aspects for forming a fine solder bump, which head unit comprises a main body portion which includes a die, a punch inserted into a through hole provided in the die in such a way that the punch can be projected from and retreated into the end surface of the die and a retaining member for retaining the die, thereby causing a fine solder filled in the through hole to adhere onto the substrate, a moving portion on which there is mounted the retaining member in such a way that the retaining member is freely movable along the direction of its approaching the substrate and which is movable in the direction of its approaching the substrate, and a sensor for sensing the relative distance between the moving portion and the main body portion in the direction of the approach thereof.

According to a sixteenth aspect of the invention, the die is a ferrule and the punch is a light waveguide member connected to a heating light source.

According to a seventeenth aspect of the invention, the main body portion has solder extruding means which is freely movable along the direction in which approach is made to the substrate, whereby the position of one of the punch and the die relative to the other is varied by the solder extruding means.

According to an eighteenth aspect of the invention, the moving portion has a rise/fall stage.

According to a nineteenth aspect of the invention, the retaining member is mounted on the moving portion through a guiding member.

According to a twentieth aspect of the invention, the retaining member is resiliently suspended from the moving portion by means of a spring member.

The invention according to a twenty-first aspect is a soldering method using the head unit of the fifteenth aspect, which soldering method is characterized by comprising a step of, after lowering the main body portion and thereby causing the solder to adhere onto the substrate, raising the moving portion by a distance corresponding to the resulting distance of one of the main body portion and the moving portion relative to the other as measured by the sensor and thereby forming a gap between the solder adhered onto the substrate and the main body portion.

Here, the solder used in this specification is defined to include, in addition to general solder, a solder paste prepared by adding flux to solder.

In the invention of the first aspect, the end surface of the punch can be retracted by a desired distance from the end surface of the die and the recess of a desired volume can thereby be provided in the end surface of the die. Therefore, by embedding solder it into this recess, it is possible to supply a fixed amount of solder corresponding to the same volume as that of the recess stably. Accordingly, when the volume of the recess is set to be a proper volume of a solder bump, it is possible to form a proper amount of solder bump at one time.

Also, when fusing the solder extruded by the punch caused to protrude from the end surface of the die and thereby forming the solder bump on the substrate, the solder embedded in the end surface of the die is extruded to a position (e.g., the copper pad or defective solder bump) where the solder bump is to be formed and then caused to contact therewith, the solder being thereafter heated and fused. As a result of this, when solder paste is used as the solder, the flux (reducing agent) contained in the solder paste excellently acts on the copper pad or defective solder bump, whereby the surface oxide film on the copper pad or defective solder bump is removed with the result that it becomes unnecessary to separately supply flux and so the operating efficiency is enhanced.

Also, since the solder is extruded from the recess of the die by the punch, the solder is more excellently separated compared to the case where a metal mask is used.

Further, by varying the distance by which the end surface of the punch is retracted from the end surface of the die, it is possible to vary the amount of the solder supplied in conformity with a desired size of the solder bump.

It is to be noted that in a case where using a metal mask, when varying the amount of the solder bump, it is needed to change the metal mask and that, further, in a case where punching out the solder foil, when varying the amount of the solder bump, it is needed to change the thickness of the solder foil. Thus, it is not easy to vary the amount of the solder bump.

In contrast to this, in the invention of the first aspect, it is possible to freely vary the amount of the solder bump by varying the volume of the recess in the end surface of the die.

Also, while in the invention of the thirst aspect the light waveguide member is used as the punch, the outside diameter precision of the light waveguide member, e.g. optical fiber is high and in addition the procurement thereof is easy. Therefore, the punch can be readily prepared.

Also, since the solder is fused by the heating light introduced by the light waveguide member, the region needed to be heated can be localized to the portion needed to be heated. Therefore, when forming the solder bump on a narrow region, no adverse effect is had on other ambient solder bumps.

Further, in a case where using an optical fiber as the light waveguide member, when the optical fiber is made of glass, the wettability of the solder on the end surface of the optical fiber is inferior to that of the copper pad or defective solder pad on which the solder bump is to be formed. Therefore, the solder can be easily transferred from the optical fiber to the copper pad or defective solder pad, with the result that the operating efficiency is enhanced.

Also, in the invention of the fourth aspect, since the punch is cleaned before the solder is embedded therein, it is possible to cause the solder to be aptly embedded into the recess formed in the punch and thereby control the amount of solder with a high precision.

Also, in the invention of the fifth aspect, since unnecessary solder is wiped off from the end surface of the die by the by-rubbing cutting operation, when transferring the solder to the copper pad or defective solder pad, this can be prevented from being obstructed by the unnecessary solder having attached onto the end surface of the die. Also, the amount of solder becomes more accurate.

In the invention of the sixth to eleventh aspects, the light waveguide member is one which is made up into a structure making it difficult for light to escape to outside the line path, and includes a linear member such as an optical fiber. Also, the guiding mechanism is so arranged as to move the light waveguide member relative to the substrate. Namely, the light waveguide member may be moved with the substrate being fixed or the substrate may be moved with the light waveguide member being fixed. Further, the solder adhered to the other end surface of the light waveguide member is defined to include a solder paste prepared by adding flux to solder.

The above-described solder bump forming method enables the formation of the solder bump on the substrate as follows.

1) First, the solder in an amount to be adhered onto the substrate is adhered onto the end surface of the light waveguide member on a side opposite to that on which the light heating source is coupled thereto, by the use of, for example, the adhesiveness.

2) Subsequently, when a heating light is output from the light heating source coupled to the light waveguide member, the heating light passes through the light waveguide member and is emitted from the end surface thereof having the solder adhered thereonto and is radiated onto the solder adhered thereon. By adjusting the energy of the radiated heating light to an intensity with which the solder is fused, the solder adhered on the end surface of the light waveguide member is fused and shaped like water drops.

3) Subsequently, when the water drop-like solder adhered on the end surface of the light waveguide member is brought into contact with a desired position on the substrate (e.g., the pad portion or the solder bump portion at which the amount of solder adhered is wanted to be increased) by using the guiding mechanism, the fused solder is adhered onto the pad portion side or the solder bump portion side at which the amount of solder adhered is wanted to be increased, having a higher wettability than the end surface of the light waveguide member. Thus, the solder bump is formed.

According to the solder bump forming method of the present invention, since the solder is fused by light and it is arranged that the solder is adhered on the end surface of the light waveguide member, it is possible to dispose the light source (heating source) at a position distant therefrom and thereby easily move the relevant portion of the apparatus and in addition also to form the solder bump with a high efficiency. Also, since the relevant portion of the apparatus can be easily moved, the solder bump forming method of the present invention can be utilized also for modifying the solder bump. In the present invention, since the solder is fused by light, even when the solder bumps are formed at very small pitches, this has only very small effects on the ambient bumps. Also, by moving the end surface of the light waveguide member which has been formed thin by the guiding mechanism, it is possible to form the solder bumps at very small pitches.

It is to be noted that the solder may be heated and fused by the heating light from the light heating source after the solder adhered on the end surface of the light waveguide member has been brought into contact with a desired position on the substrate. By doing so, when there is used the solder paste, the flux in the solder paste sufficiently acts on the copper pad, with the result that the adhesion of the solder bump onto the copper pad is enhanced. Also, if the light waveguide member is spaced away from the solder kept in contact with the substrate and the heating light is thereafter radiated thereonto, the configuration of the formed solder bump becomes improved.

According to the method of the ninth aspect, since the solder paste is adhered onto the copper pad and thereafter the forward end of the light waveguide member is spaced by a suitable distance from the copper pad, even when the amount of solder is large, it is possible to avoid the fused solder and the forward end of the optical fiber from interfering with each other and thereby prevent the configuration of the formed solder bump from being distorted and prevent the severed solder balls from being inconveniently produced.

Further, the invention of the twelfth aspect is an apparatus for achieving the method of the first to fifth aspects, which apparatus comprises a die having a through hole provided therein and a punch slidably inserted into this through hole and is of a type enabling a desired amount of solder to be supplied through the simple operation of merely embedding the solder into the recess formed by the die and the punch.

In the invention of the twelfth aspect, preferably, the die is a ferrule and the punch is an optical fiber.

Further, preferably, cleaning means for cleaning a forward end of the ferrule having the solder embedded therein is provided.

According to the invention of the fifteenth aspect, it is possible to provide a head unit for use in the solder bump forming apparatus, which when adhering the solder onto a desired position of the substrate and forming a fine solder bump enables the high-precision control of the relative position between the member retaining the solder and the substrate.

According to the invention of the sixteenth aspect, it is possible to form a very fine solder bump at a desired position. Also, the effect which is had on the solder bumps already formed therearound is small.

According to the inventions of the seventeenth and nineteenth aspects, it is possible to move the main body portion relative to the moving portion in the direction in which approach thereof is made to the substrate.

According to the invention of the eighteenth aspect, it is possible to move the moving portion in the direction of the approach thereof being made to the substrate in a state where the main body portion is mounted thereon so that the main body portion may be freely movable in the direction of the approach thereof being made to the substrate.

According to the invention of the twentieth aspect, it is possible to suppress the excessive squashing of the solder to be adhered onto the substrate and avoid the resulting occurrence of a state where the solder paste is severed to obstruct the formation of an excellent solder bump.

According to the invention of the twenty-first aspect, it is possible to make a precise upward/downward motion of the main body portion for forming the solder bump. Also, it becomes possible to make a delicate increase/decrease of the force for pressing the solder against the substrate. When using a heating light coming on through the optical fiber as the heating source for fusing the solder, making the distance between the forward end of the optical fiber and the solder paste excessively large could result in that the energy of the heating light is dispersed and as a result it sometimes becomes impossible to fuse the solder sufficiently. However, the present invention can cope with this.

The above and other objects, features and advantages of the present invention will become more apparent from the following detailed description which will be taken in conjunction with the appended drawings.

BRIEF DESCRIPTION OF THE DRAWINGS

FIG. 3 is a schematic constructional view illustrating an embodiment of a solder bump forming apparatus for executing another solder bump forming method according to the present invention;

FIGS. 5A to 5C are step views illustrating another solder bump forming method based on the use of the above-described solder bump forming apparatus;

FIG. 14 is a front view illustrating a solder supply unit provided in the solder bump forming apparatus of FIGS. 7A to 8B;

FIG. 15 is a plan view illustrating the supply unit of FIG. 14;

DETAILED DESCRIPTION OF THE PREFERRED EMBODIMENTS

First Embodiment

Figure 1A:
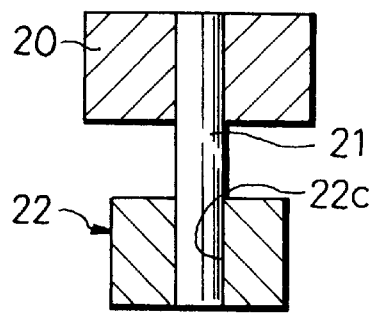
FIGS. 1A to 1E are views illustrating an embodiment of a solder bump forming method and solder bump forming apparatus according to the present invention.

FIGS. 1A to 1E are views illustrating an embodiment of a solder bump forming method and a solder bump forming apparatus according to the present invention. This embodiment is a solder bump forming method which using a solder bump forming apparatus forms a desired amount of fine solder bump on a copper pad with a high efficiency. This method is as follows. Namely, 1) First, as illustrated in FIG. 1A, one end of a punch 21 having a fine cross section whose diameter is around 0.1 to 0.3 mm was fixed to a holder 20 and the other end thereof was slidably inserted into a through hole 22c of a die 22. The holder 20 is movable by operating means (not illustrated) relative to the die 22 in a longitudinal direction of the punch 21.

Figure 1B:
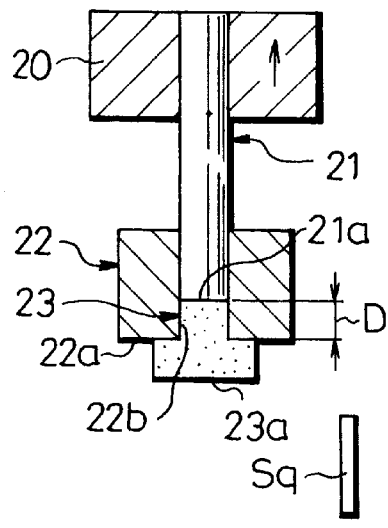

2) Subsequently, by moving the holder 20, an end surface 21a of the punch 21 was retracted by a distance D from an end surface 22a of the die 22. Accordingly, a recess 22b was open at the end surface 22a. The volume V of the recess 22b was set to be substantially equal to the volume of a fine solder bump desired to be formed. Thereafter, solder paste was embedded into the recess 22b by embedding means Sq such as a squeegee (FIG. 1B). At this time, there may be a case where the solder paste 23a adheres onto the end surface 22a.

Figure 1C:
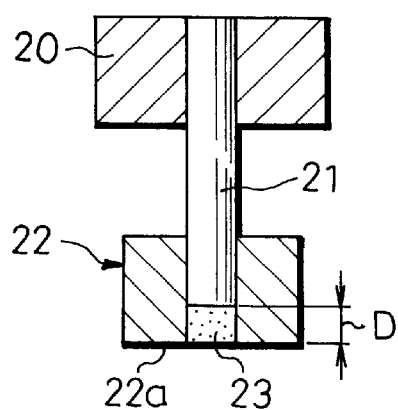

3) Subsequently, the solder paste 23a adhered onto the end surface 22a of the die 22 was by-rubbing cut, whereby the volume of the solder paste 23 was made to be a desired value (FIG. 1C).

4) Subsequently, the punch 21 was pushed to thereby cause the end surface 21a to protrude from the end surface 22a of the die 22, whereby the solder paste 23 was brought into contact with a copper pad 25 of a substrate 24 on which the solder bump was to be formed.

Figure 1D:
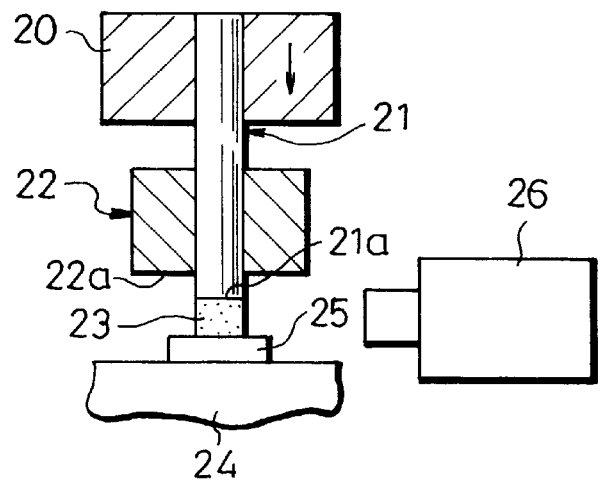

5) Thereafter, the solder paste 23 was heated and fused by a non-contact type heating light source 26 such as a laser light source or halogen lamp (FIG. 1D).

Figure 1E:
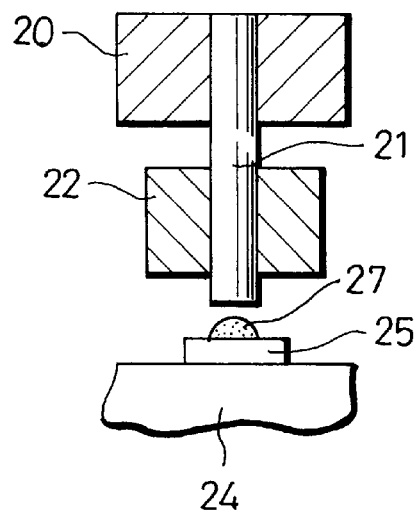

Then, since the solder paste 23 contains flux therein, the solder paste 23 became conformed with the copper pad 25, with the result that a desired amount of fine solder bump 27 was formed with a high efficiency (FIG. 1E).

Here, it was confirmed that although in the conventional solder bump forming method when forming the solder bump one at a time, the pitch was around 0.5 mm and the size was around 0.3 mm in diameter, according to the present invention the solder bump could be formed up to a pitch of around 0.2 mm and a size of 0.1 mm or so.

Second Embodiment

Figure 2A:
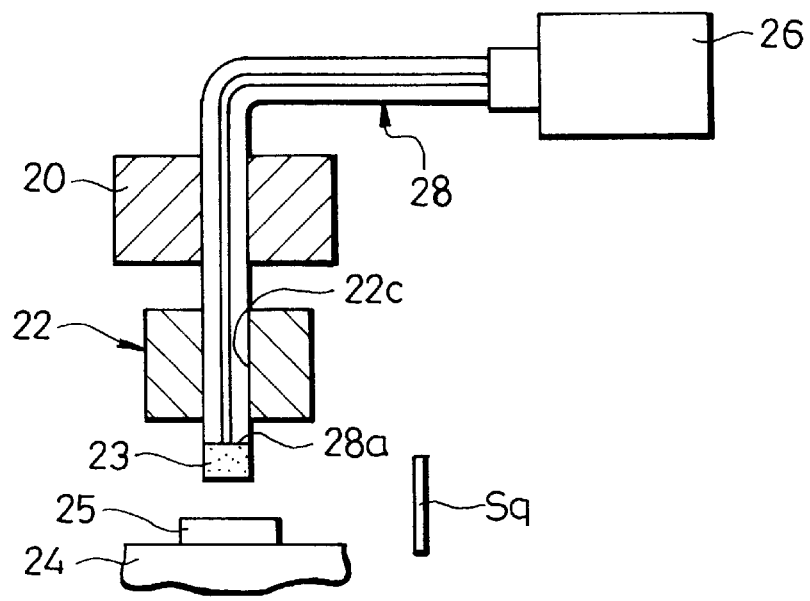
FIGS. 2A to 2D are views illustrating another embodiment of the solder bump forming method and solder bump forming apparatus according to the present invention.

This embodiment relates to another embodiment of the solder bump forming method and solder bump forming apparatus according to the present invention. In this embodiment, as illustrated in FIG. 2A, as the punch there is used an optical fiber 28.

The optical fiber 28 is retained by the holder 20 and one end thereof is slidably inserted into the through hole 22c of the die 22. The solder paste 23 of a desired volume embedded by the embedding means Sq such as a squeegee into the recess formed between the optical fiber 28 and the die 22 as in the case of the first embodiment was extruded by an end surface 28a.

Figures 2B, 2C, 2D:
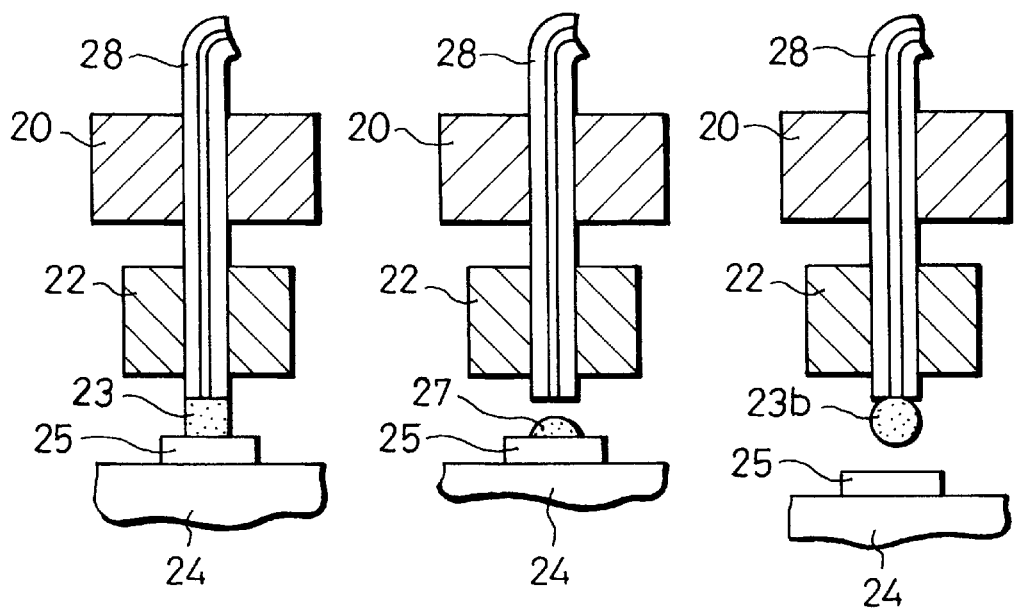

Subsequently, the solder paste 23 was brought into contact with the copper pad 25 on the substrate 24 on which the solder bump was to be formed (FIG. 2B) and then was heated and fused, whereby the solder bump 27 was formed (FIG. 2C).

The heating of the solder paste 23 was performed by introducing the heating light from the heating light source 26 into the optical fiber 28. As the heating light source 26 there can be used a semiconductor laser element, halogen lamp, or xenon lamp or so forth.

It is to be noted that, as illustrated in FIG. 2D, when forming the solder bump 27, the solder paste 23 may be heated without being caused to contact with the copper pad 25 to thereby form a solder ball 23b and thereafter the solder ball 23b may be transferred to the copper pad 25 so as to form the solder bump 27.

Third Embodiment

FIG. 3 illustrates another embodiment of the solder bump forming method and solder bump forming apparatus according to the present invention and is a schematic constructional view illustrating the solder bump forming apparatus.

In FIG. 3, a reference numeral 30 denotes an optical fiber having a core 30a constituting a waveguide path portion and a reference numeral 31 denotes a heating light source optically coupled to a one end surface 30c of the optical fiber 30, which heating light source has a xenon lamp and a reflection plate. Also, a reference numeral 32 denotes a guiding mechanism for moving an end surface 30b of the optical fiber 30 relatively to a printed circuit board 33. The guiding mechanism 32 comprises a retaining member 32a for retaining the optical fiber 30, a guide member 32b for supporting the retaining member 32a so that the retaining member 32a may be movable upward and downward and for having an end surface 30b of the optical fiber accommodated therein, and a moving shaft 32c for supporting the guide member 32b so that this guide member 32b may be movable in the direction of its being moved toward or away from the printed circuit board 33, the moving shaft 32c being moved along the surface of the printed circuit board 33. Here, the guide member 32b serves concurrently as the die through which the optical fiber 30 serving concurrently as the punch is slidably inserted.

Figure 4A:
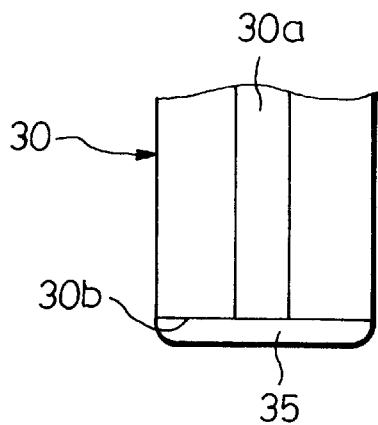
FIGS. 4A to 4D are step views illustrating the solder bump forming method based on the use of the above-described solder bump forming apparatus.

The solder bump forming process executed using the above-described solder bump forming apparatus is as follows. Namely, explaining with the use of FIG. 4, 1) first, a solder paste 35 prepared by adding flux to a low fusing point solder is adhered onto an end surface 30b of the optical fiber 30 by adhering strength (FIG. 4A). At this time, as in the case of the first and second embodiments, the solder paste 35 is embedded into the recess formed between the end surface 30b of the optical fiber 30 and the guide member 32b by using the embedding means Sq (see FIG. 3) such as a squeegee to thereby adhere the solder paste 35 onto the end surface 30b. The amount of the low fusing point solder contained in the solder paste 35 corresponds to the amount of the solder to be adhered onto a copper pad 34 (see FIG. 4C) formed on a printed circuit board 33.

Also, as the solder paste 35 there is used, for example, micro-solder produced by Harima Chemicals Inc. This material is one prepared by adding solder particles having a particle size of 15 to 30 μm to paste and mixing both together so as to disperse the former into the latter. It has a strong active force and has a fusing point of 183° C.

2) Subsequently, a heating light is emitted from a heating light source 31 coupled to the optical fiber 30. Then, the heating light propagates through the core 30a of the optical fiber 30 and is emitted from the end surface 30b having the solder adhered thereon and is radiated onto the solder paste 35 adhered on the end surface 30b.

Figure 4B:
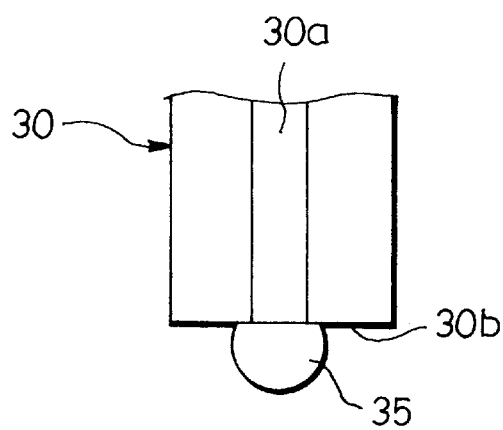

At this time, by adjusting the energy of the radiated heating light to an intensity with which the solder paste 35 can be fused, the solder paste 35 adhered onto the end surface 30b of the optical fiber 30 is fused from the core 30a portion and is finally fused as a whole and is gathered at the core 30a portion in the form of a water drop (FIG. 4B).

Figure 4C:
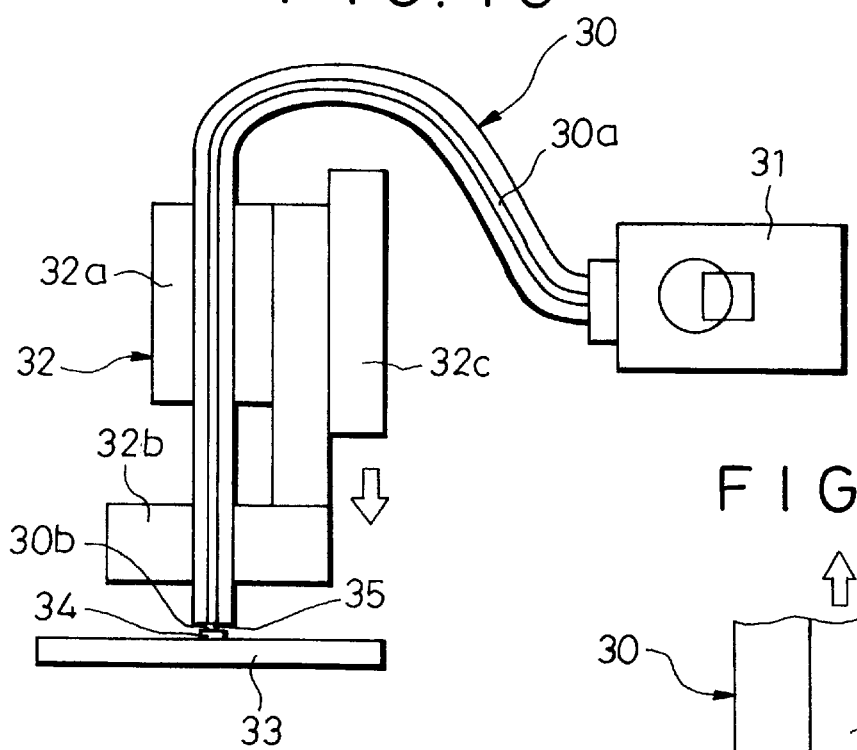

3) Subsequently, the guide member 32b is lowered along the moving shaft 32c, whereby the water drop-like solder paste 35 formed on the end surface 30b of the optical fiber 30 is brought into contact with the copper pad 34 (FIG. 4C).

Figure 4D:
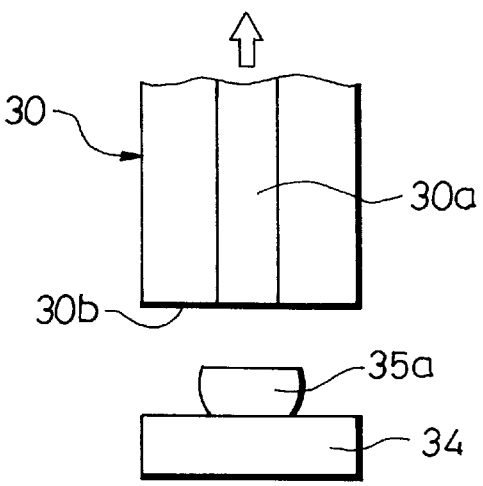

4) Subsequently, when the optical fiber 30 is raised along the moving shaft 32c and thereby is moved in the direction of its being spaced away from the copper pad 34, the solder paste 35 is transferred from the end surface 30b of the optical fiber to the side of the copper pad 34 having a higher wettability than this end surface 30b, thus the solder bump 35a is formed (FIG. 4D).

As described above, according to the solder bump forming apparatus, a fine solder bump can be formed with a high efficiency and besides, since only the optical fiber 30 is moved by the guiding mechanism 32, the movement of the optical fiber also is easy. In addition, when forming the solder bump using the above-described solder bump forming apparatus, a fine solder bump can be formed with a high efficiency without influencing the ambient area. Therefore, when modifying the defective formation of the bumps needed to be formed with small pitches, also, no adverse effect is had on the bumps which have been already formed.

It is to be noted that if, at this time, flux is coated beforehand onto the copper pad 34 or the copper pad 34 is pre-heated together with the printed circuit board 33, the solder paste 35 becomes more easily transferred from the end surface 30*b* of the optical fiber 30 to the copper pad 34. Preferably, this pre-heating temperature is a relatively high temperature which causes no problem such as oxidation in the substrate. In this embodiment, preferably, the pre-heating temperature is not higher than 100° C. and as high as possible.

Also, in a case where there has been formed an unqualified solder bump the amount of whose solder is lesser than a proper amount to be adhered, the solder paste corresponding to an amount of solder in which the solder bump is deficient is adhered onto the end surface 30*b* of the optical fiber 30 and, as mentioned above, this solder paste is heated and fused and caused to contact with the unqualified solder bump. By doing so, the unqualified solder bump can be made into a qualified solder bump the amount of whose solder is proper.

Further, although, in the foregoing description, the solder paste 35 has been adhered onto the end surface 30*b* of the optical fiber 30 (FIG. 4A), a suitable amount of solder ball in place of the solder paste 35 may be adhered onto the end surface 30*b* by using adhesive flux or by being fused by the heating light source 31.

Also, as illustrated in FIGS. 5A to 5C, when forming the solder bump 35*b*, by adjusting the height of the end surface 30*b* of the optical fiber 30, it is possible to control the height H (see FIG. 5C) of the solder bump 35*b* formed on the copper pad 34. Also, since the upper surface (the mounting side of an IC or the like) of the solder bump 35*b* formed in this way is made to be a flat surface, the flattening step conventionally executed after the formation of the solder bump becomes unnecessary.

On the other hand, although in this embodiment the light waveguide member is shaped as a whole like a fiber, only if light is difficult to escape to outside the prescribed line path, a glass block having a light waveguide path formed therethrough can be also used. In this case, if the side thereof on which the solder is adhered is formed thin in the shape of a fiber, a good convenience will be given. Also, the heating light source side thereof may be of any type only if it is made up into a structure optically coupled to the core portion of the solder adhered end surface. For example, a light circuit such as a light waveguide path may be used.

Also, as the heating light source there can be used a halogen lamp or semiconductor laser element in addition to a xenon lamp. Since the semiconductor laser element is compact and the service life thereof also is long, the solder bump forming apparatus which uses the semiconductor laser element has an excellent property in terms of the maintenance.

Fourth Embodiment

Here, in the above-described embodiment, an explanation has been given of the case where the solder bump 35*a* is formed by causing the solder paste 35 adhered onto the end surface 30*b* of the optical fiber 30 to be fused at the core 30*a* portion of the optical fiber 30 into a water drop-like configuration and causing the water drop-like solder paste 35 to contact with the copper pad 34.

However, in the solder bump forming method of the present invention, the solder bump may be formed on the substrate by introducing the heating light from one end surface of the optical fiber 30 and radiating this heating light onto the solder adhered onto a copper pad from the end surface 30*b* of the optical fiber 30 to thereby fuse this solder. Therefore, the method illustrated in FIG. 6 can also be adopted.

Figure 6A:
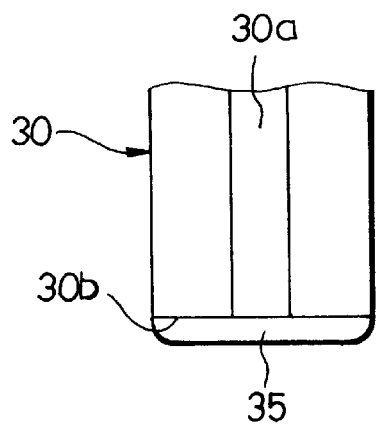
FIGS. 6A to 6D are step views illustrating still another solder bump forming method based on the use of the above-described solder bump forming apparatus.
Figure 6B:
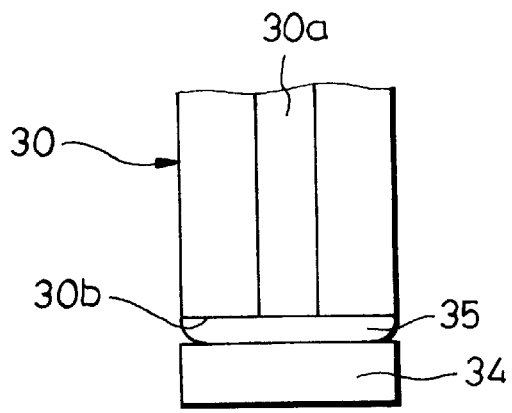

(1) The solder paste 35 (FIG. 6A) adhered onto the end surface 30*b* of the optical fiber 30 is directly adhered onto a copper pad 34 of a printed circuit board 33 as is (FIG. 6B).

Figure 6C:
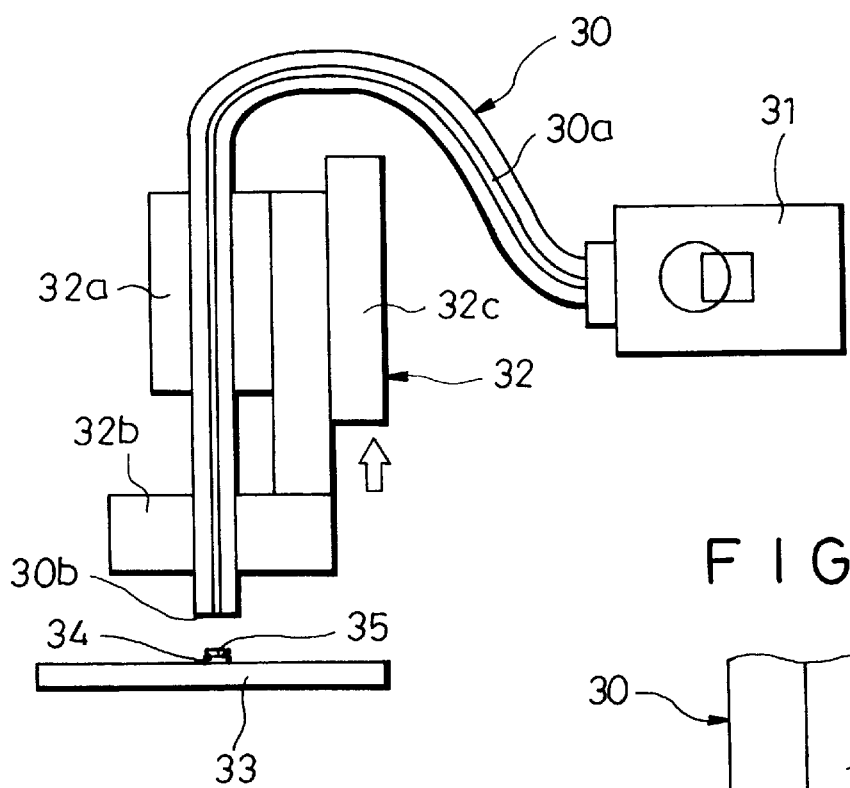
Figure 6D:
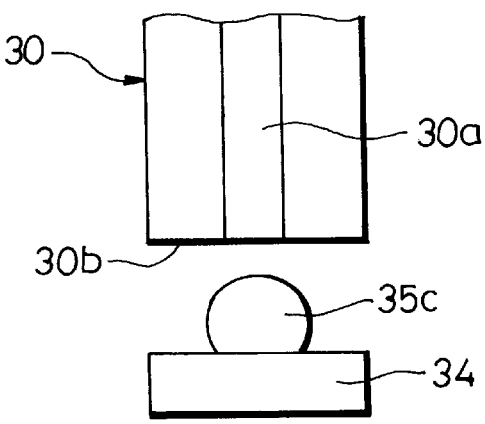

(2) Next, the end surface 30*b* of the optical fiber 30 is spaced away from the copper pad 34 to thereby cause the solder paste 35 and the end surface 30*b* to be separated from each other. Then, as illustrated in FIG. 6C, the heating light is introduced from the heating light source 31 into the core 30*a* of the optical fiber 30 to thereby fuse the solder paste 35. By doing so, a solder bump 35*c* is formed on the copper pad 34 as illustrated in FIG. 6D.

Thereafter, the thus-formed solder bump 35*c* is pressed from above according to the necessity to thereby form a flat upper surface.

When forming the solder bump 35*c* by adhering the solder paste 35 onto the copper pad 34 of the printed circuit board 33 and thereafter introducing the heating light from the end surface of the optical fiber 30, the flux in the solder paste sufficiently acts on the copper pad 34, whereby it is possible to form the solder bump 35*c* with excellent adherability which has been firmly adhered onto the copper pad 34.

Also, when fusing the solder paste 35 by introducing the heating light from the heating light source 31 into the optical fiber 30 in a state where the end surface 30*b* of the optical fiber 30 is spaced away from the copper pad 34, if the amount of solder is large, there may occur a case where the fused solder is highly raised due to the surface tension. However, since the end surface 30*b* of the optical fiber 30 is spaced away from the solder paste 35, the fused solder makes no contact with the optical fiber 30. For this reason, in this embodiment, it is also possible to avoid the configuration of the solder bump 35*c* which is being formed from being deformed due to the existence of the optical fiber 30.

It is to be noted that in this embodiment also, it is better to pre-heat the printed circuit board 33 beforehand. At this time, a heater for example is used for pre-heating of the printed circuit board 33 including the copper pad 34. The heating temperature at this time had better be a relatively high temperature which causes no problem such as oxidation in the substrate. In this embodiment, it is not higher than 100° C. and as high as possible. In a case where the above-mentioned micro-solder is used as the solder paste 35, it is preferable to use as the heating light a light whose wavelength is as short as 800 to 1000 nm and it is preferable that the temperature of the printed circuit board 33 be not higher than 100° C.

When pre-heating the printed circuit board 33 beforehand, it is possible to fuse the solder while suppressing the power of the heating light and sufficiently avoiding the possibility of causing damage to the printed circuit board 33 to thereby form the solder bump 35*c*. Also, since the heat efficiency is enhanced as a result of the preliminary heating of the printed circuit board 33, the time period in which the solder paste 35 is heated by the heating light can also be shortened and simultaneously the operating time period for executing the formation of the solder bump can also be shortened.

Fifth Embodiment

Next, an embodiment which relates to each of the solder bump forming method, solder bump forming apparatus, head unit used in the solder bump forming apparatus and soldering method using the head unit will be explained in detail with reference to FIGS. 7 to 22.

As illustrated in FIGS. 7 to 10, the solder bump forming apparatus (hereinafter referred to simply as "bump forming apparatus") 1 comprises a housing 2 in which there are provided an X-axis robot 3, two Y-axis robots 4, conveyor 5, pre-heating portion 6, head unit 7 and supply unit 8, the respective operations of which are controlled by a controller 9 such as a programmable computer in accordance with a preset flow of operation. Also, the housing 2 is provided with a monitor 2a on an upper surface thereof.

Ball screws are respectively used for the X-axis robot 3 and Y-axis robots 4. The X-axis robot 3 is disposed in parallel with the conveyance direction of the conveyor 5 and the two Y-axis robots are disposed in a direction intersecting the conveyance direction of the conveyor 5 at a right angle with two Y-axis robots 4 and the head unit 7 is supported thereby in such a way that the head unit 7 is freely movable in the axial direction thereof. And, the X-axis robot 3 is moved in the direction intersecting the conveyance direction of the conveyor at a right angle with respect thereto. Accordingly, in the following description, the direction which is the conveyance direction of the conveyor 5 and simultaneously is the axial direction of the X-axis robot 3 is referred to as "the X-axial direction", while, on the other hand, the direction which is the direction perpendicular to the conveyance direction of the conveyor 5 and simultaneously is the axial direction of the Y-axis robots 4 is referred to as "the Y-axial direction".

The conveyor 5 conveys to the pre-heating portion 6 the printed circuit board (hereinafter referred to simply as "the substrate") $S_p$ conveyed from a conveyance inlet (not illustrated) provided on the right side of the housing 2 and conveys the substrate $S_p$ on which a solder bump is formed at a desired position there as later described to a conveyance outlet (not illustrated) provided on the left side of the housing 2.

The pre-heating portion 6 is a portion for preliminarily heating the substrate $S_p$ conveyed thereto for a prescribed time period and is disposed at a position beneath an intermediate portion of the conveyor 5 as viewed in the X-axial direction. At this position, a pre-heating plate 6a containing a heater therein is disposed in such a way that the pre-heating plate 6a can freely rise and fall. Here, preferably, the heating temperature of the substrate $S_p$ is a temperature which falls within a range causing no problem such as oxidation in the substrate $S_p$ and which is as high as possible, e.g., a temperature of somewhat lower than 100° C. As the solder, there is used solder paste such as, for example, micro-solder produced by Harima Chemicals Inc. This solder paste is one prepared by adding solder particles having a particle size of 15 to 30 μm to paste and mixing both together and dispersing the former into the latter. It has a strong active force and a fusing point of 183° C. When using this solder paste, it is preferable that the substrate $S_p$ be pre-heated with its temperature being set to be 80 to 100° C.

The head unit 7 is a unit for causing the solder to adhere onto a desired position of the substrate $S_p$, for example, a copper pad and is mounted on a shaft of the X-axis robot 3 so that the head unit 7 may be freely movable in the axial direction thereof. As illustrated in FIGS. 9 to 13, the head unit 7 comprises a main body portion 71, moving portion 72 and sensor 73.

The main body portion 71 is a portion for causing the solder supplied to a forward end of an optical fiber 714 as later described by the supply unit 8 to adhere onto the substrate $S_p$, and comprises a rise/fall plate 711, first rise/fall stage 712, ferrule 713 and optical fiber 714.

Figure 9:
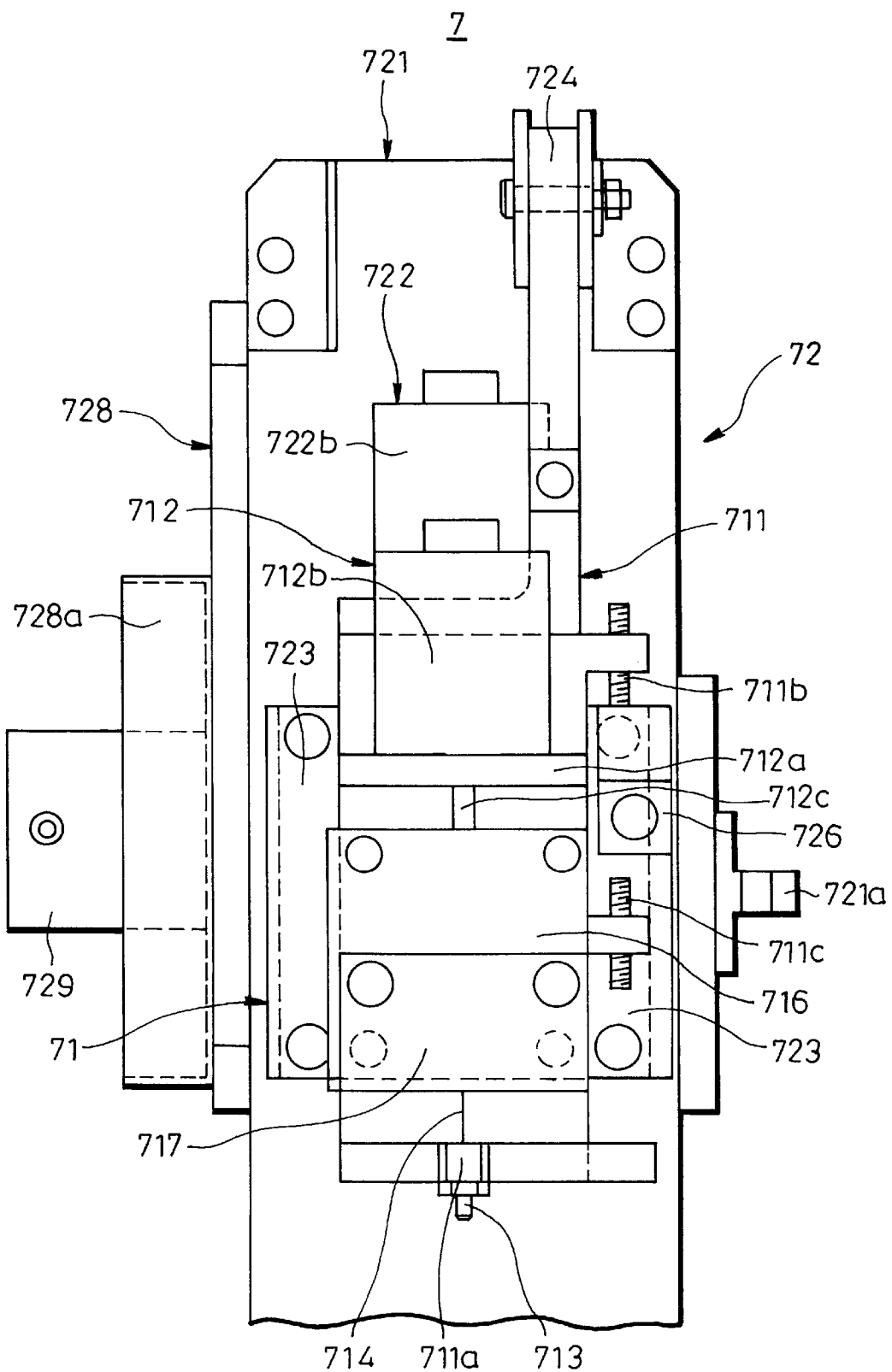
FIG. 9 is a front view illustrating a head unit used in the solder bump forming apparatus of FIGS. 7A to 8B.
Figure 10:
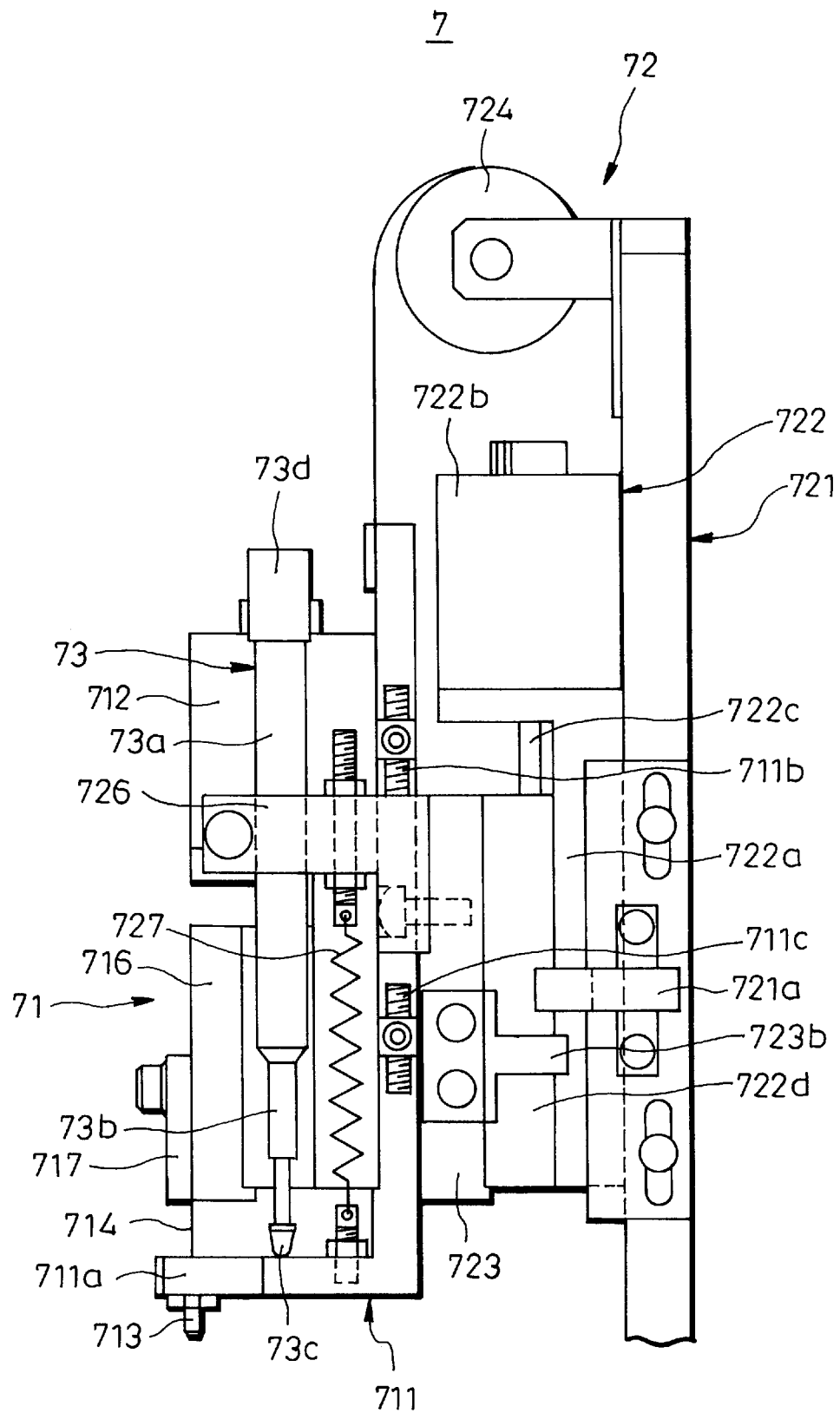
FIG. 10 is a right side view illustrating the head unit of FIG. 9.

The rise/fall plate 711 is mounted on a guide member 723 as later described of a moving portion 72 through a slider 715 so that the rise/fall plate 711 maybe vertically freely movable, and is resiliently supported by the moving portion 72 with a prescribed spring force through a constant tension spring 724 connected to the top thereof. The rise/fall plate 711 is a vertically elongate retaining member which retains the ferrule 713 and optical fiber 714 and is provided at its lower portion with a horizontally extending arm 711a. As illustrated in FIGS. 9 and 10, at a side portion of the rise/fall plate 711, there are mounted an upper stopper 711b and a lower stopper 711c, each made up using a screw, which regulate a relative vertical permissible movement width between the moving portion 72 and the main body portion 71 in cooperation with a supporting arm 726 as later described.

The first rise/fall stage 712 is a stage using a feed screw and comprises a supporting plate 712a mounted on the rise/fall plate 711, a main body 712b, a screw shaft 712c and a slider 712d which moves vertically. The ferrule 713 is a single fiber ferrule which is screwed into a mounting hole formed in a forward end of the arm 711a and functions as a die. The optical fiber 714 is pinched and fixed at a position spaced slightly from a forward end thereof by a pressing plate 717 to a fixing plate 716 mounted on the slider 712d. The forward end thereof downwardly extended is inserted into a fiber hole of the ferrule 713 so that this forward end can protrude from and retreat into this fiber hole. The optical fiber 714 is fixed to the fixing plate 714 by having suitably adjusted an amount thereof inserted into the fiber hole of the ferrule 713. By having suitably adjusted by the first rise/fall stage 712 its amount inserted into the fiber hole of the ferrule 713, the optical fiber 714 can set the amount of solder embedded into a space formed between the fiber hole and the optical fiber 714 to be at a desired value. On the other hand, the other end of the optical fiber 714 is wound around a former 728a (see FIGS. 12 and 13) of the moving portion 72 as later described, whereby the slack is tensioned. Thereafter, this other end is connected to a laser diode module 725 (see FIG. 13).

The moving portion 72 supports the rise/fall plate 711 so that this plate 711 may be freely movable in the direction of the approach thereof being made to the substrate $S_p$, and comprises a base 721, a second rise/fall stage 722, a guide member 723, the former 728a and the laser diode (hereinafter referred to simple as "LD") module 725.

Figure 12:
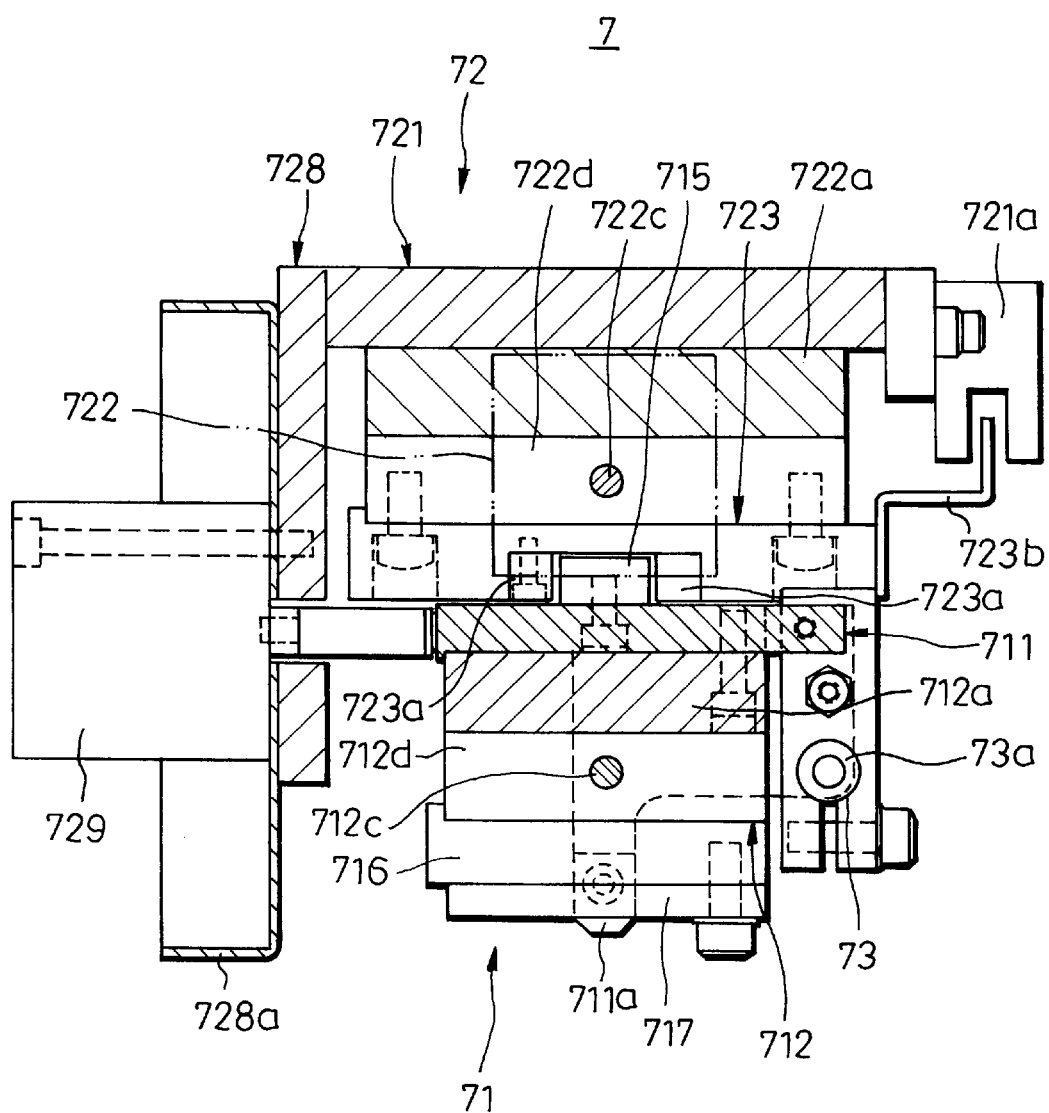
FIG. 12 is a sectional view taken along a line XII—XII of FIG. 11.

The base 721 is mounted on the shaft of the X-axis robot 3 so that this base 721 may be freely movable in the axial direction thereof and has the constant tension spring 724 mounted on the top thereof. As illustrated in FIGS. 10 and 12, the base 721 has mounted at a side portion thereof a photo-sensor 721a for detecting that the head unit 7 is in an elevated position. The second rise/fall stage 722 is constructed as in the case of the first rise/fall stage 712, and comprises a supporting plate 722a mounted on the base 721, a main body 722b, a screw shaft 722c and a slider 722d which moves vertically.

Figure 11:
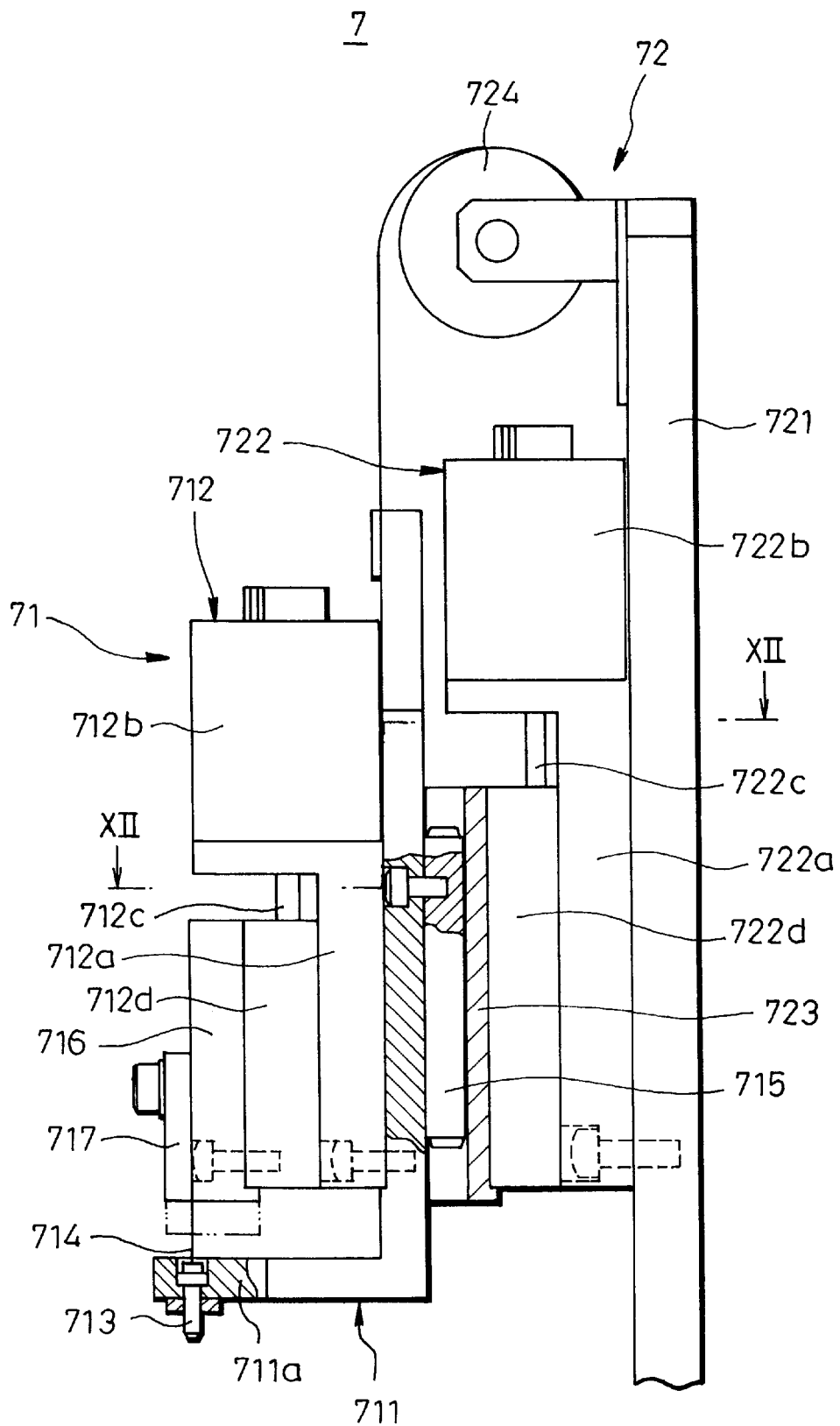
FIG. 11 is a right side view, partly in section, of the head unit of FIG. 10.

As illustrated in FIGS. 11 and 12, the guide member 723 is mounted on the slider 722d and guides the vertical movement of the slider 715 provided on the main body portion 71 by two guide rails 723a (see FIG. 12). Also, on the side portion of the guide member 723, there is mounted a detecting piece 723b (see FIGS. 10 and 12) for detecting that the head unit 7 is in an elevated position in cooperation with the photo-sensor 721a provided on the base 721. Here, as illustrated in FIGS. 10 and 12, the guide member 723 has mounted thereon a supporting arm 726 for supporting a sensor 73 as later described.

As illustrated in FIG. 10, an extension spring 727 is provided between the supporting arm 726 and the arm 711a of the rise/fall plate 711. Accordingly, although the rise/fall plate 711 is vertically freely movably mounted on the guide member 723 through the slider 715, the rise/fall plate 711 is supported on the moving portion 72 with a prescribed spring force by the constant tension spring 724 and extension spring 727. This spring force is set so that when the solder adhered on the forward end of the optical fiber 714 is adhered onto a desired position of the substrate $S_p$, the main body portion 71 can be upwardly moved with a value which corresponds to several grams to several tens of grams capable of preventing the solder from being excessively squashed by the force acting from the optical fiber 714 onto the solder.

Figure 13:
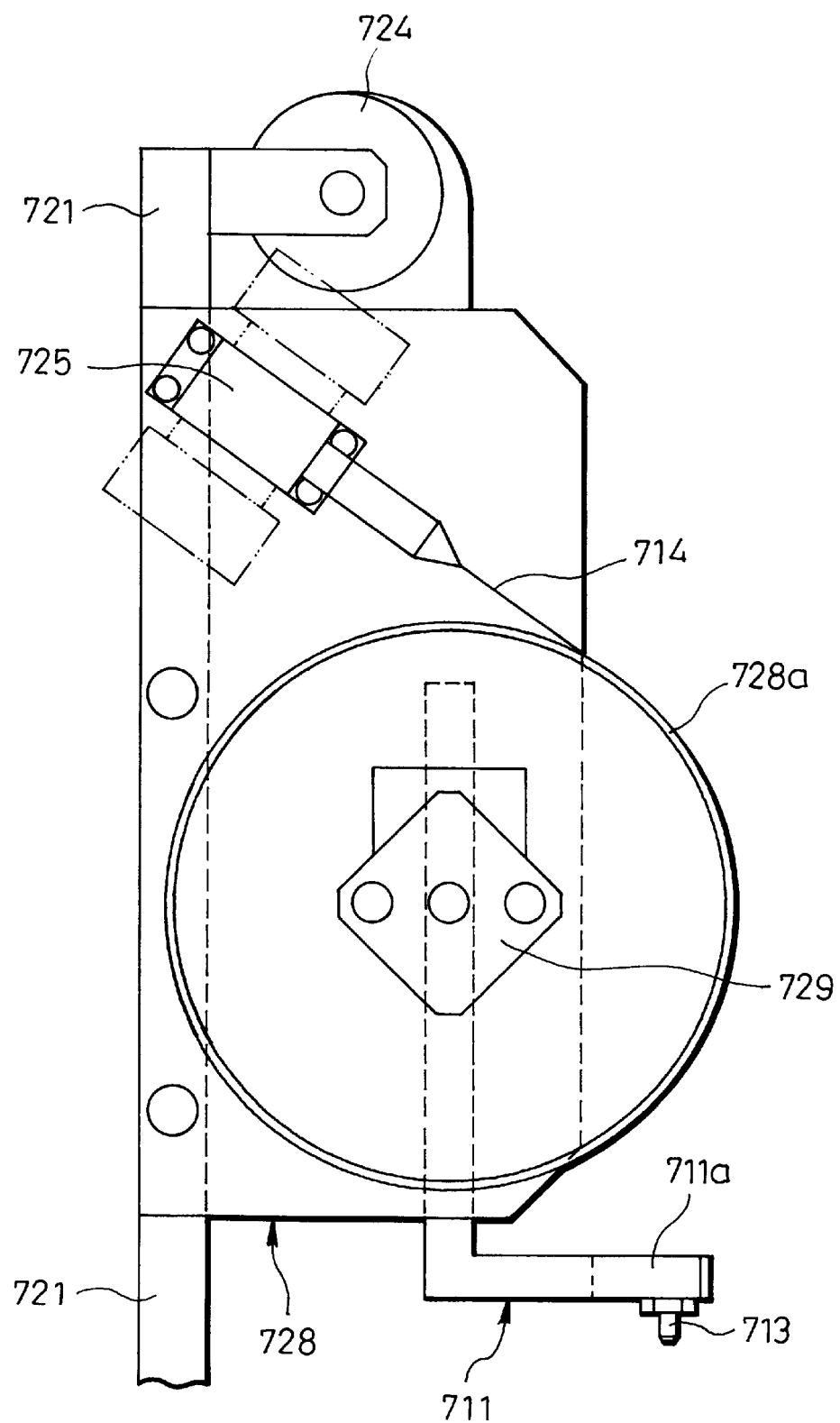
FIG. 13 is a left side view illustrating the head unit of FIG. 9.

As illustrated in FIGS. 12 and 13, the former 728a is a hollow cylindrical member mounted on a mounting plate 728 provided on the side surface of the base 721 and has mounted at a central part thereof a cylinder 729 for pressing a side surface of the rise/fall plate 711 to thereby suppress the backlash of the main body portion 71 and moving portion 72 resulting from the movement of the head unit 7. On the other hand, as illustrated in FIG. 13, the LD module 725 is provided on an upper part of the mounting plate 728 and is arranged to emit a heating light into the optical fiber 714 and fuse the solder supplied from the supply unit 8. At this time, when using the micro-solder as the solder, as the heating light there is preferably used a heating light whose wavelength falls within a range of 800 to 1000 nm.

The sensor 73 is a contact type displacement sensor which is supported by the supporting arm 726 provided on the moving portion 72 and intended to sense the relative distance between the rise/fall plate 711 and the moving portion 72. The sensor 73 has a trunk portion 73a fixed to the supporting arm 726 and has a rod 73b downwardly extended from the trunk portion 73a, the rod 73b having mounted on a lower end thereof a contactor 73c abutting on the upper surface of the arm 711a of the rise/fall plate 711. Here, the sensor 73 is connected to the controller 9 of the housing 2 through a cord not illustrated connected to a connector 73d provided on the top thereof and thereby controls the relative distance between the arm 711a and the substrate $S_p$ with a high precision. However, although, in this embodiment, the contact type displacement sensor has been used as the sensor 73, a non-contact type sensor such as a laser displacement gage may be used.

Figure 7A:
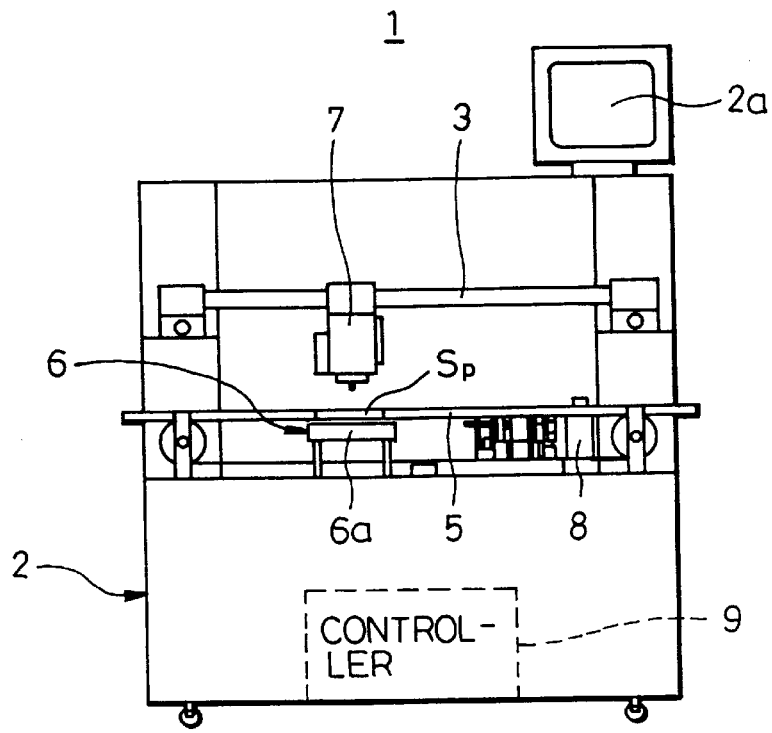
FIG. 7A is a front view illustrating another embodiment of a solder bump forming apparatus according to the present invention and FIG. 7B is a side view illustrating the same.
Figure 7B:
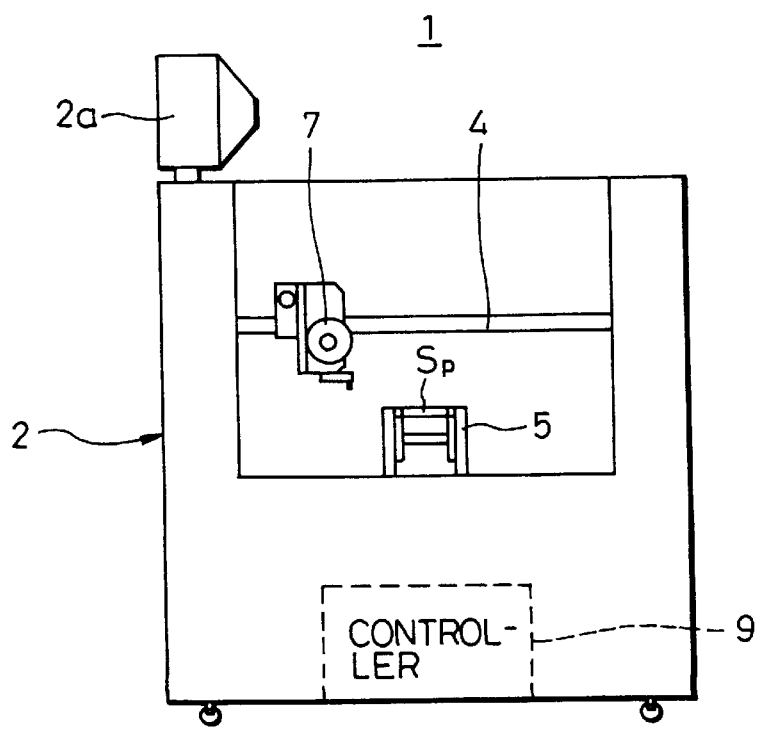
Figure 8A:
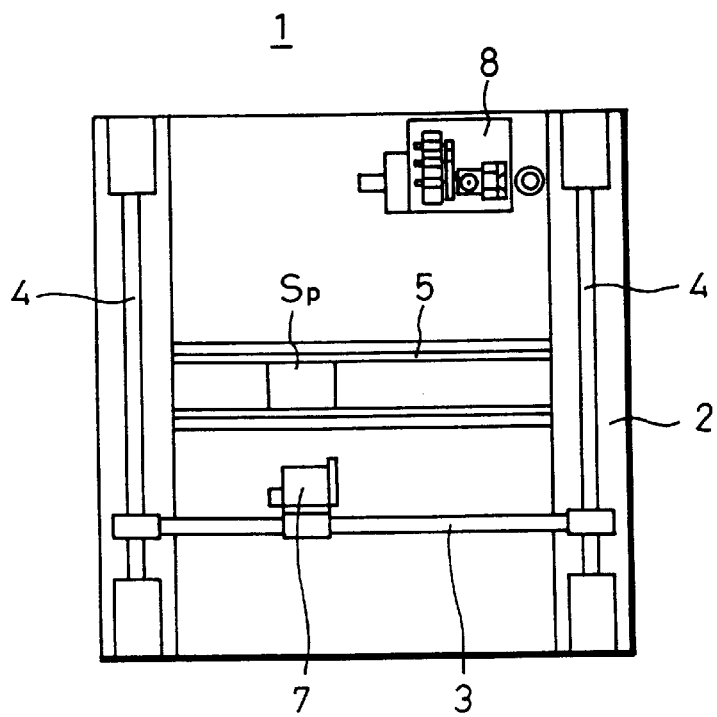
FIG. 8A is a plan view illustrating the solder bump forming apparatus according to the present invention and FIG. 8B is a back side view illustrating the same.
Figure 8B:
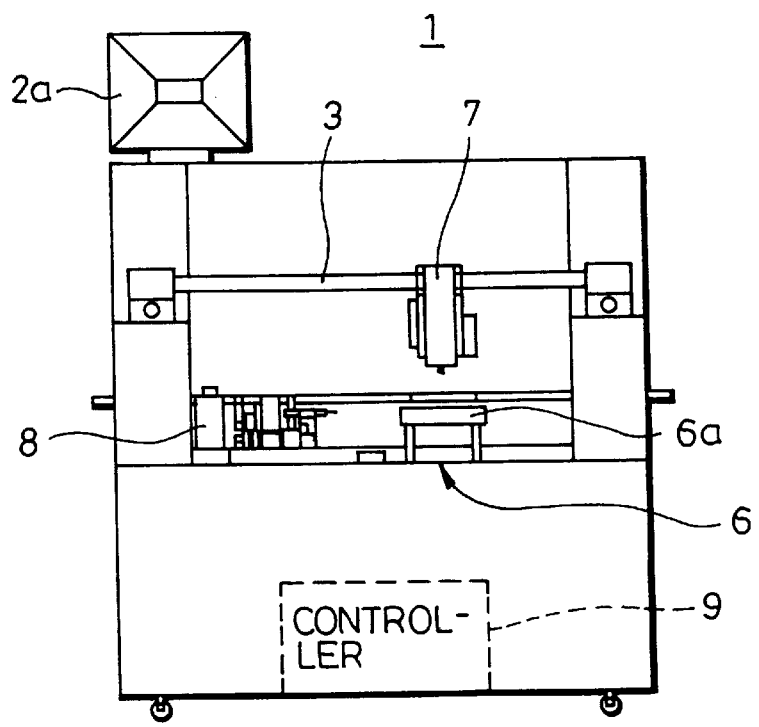

As illustrated in FIGS 7A and 8A, the supply unit 8 is located at the right back position of the housing 2. The supply unit 8 is a unit for supplying the solder to the main body portion 71 of the head unit 7 and, as illustrated in FIGS. 14 to 22, is disposed on a base 80 provided on the housing 2 and comprises a cleaning portion 81, an embedding portion 82, a by-rubbing cutting portion 83, a monitoring portion 84 and a moving stage 85.

Figure 17:
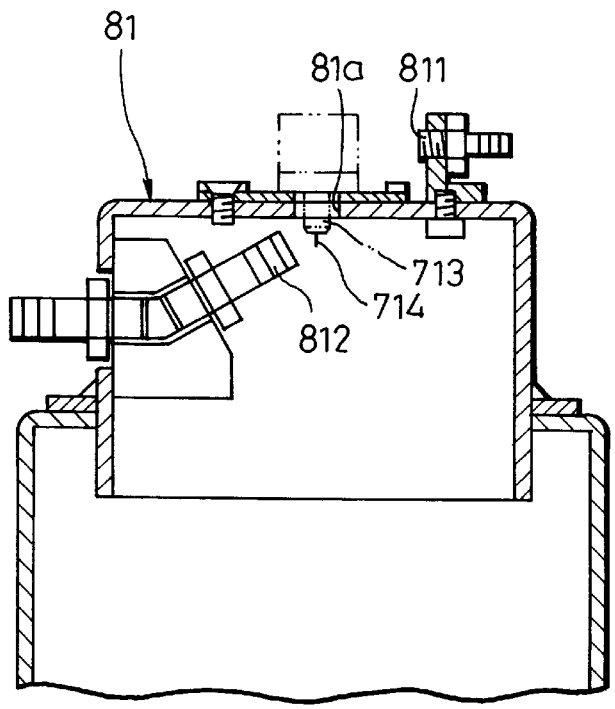
FIG. 17 is an enlarged view illustrating a main part of the cleaning portion provided in the supply unit of FIG. 14 on an enlarged scale.

The cleaning portion 81 is a portion for cleaning the ferrule 713 to which the solder is supplied and for cleaning a forward end of the optical fiber 714 and, as illustrated in FIG. 15, is located between the embedding portion 82 and the by-rubbing cutting portion 83 of the moving stage 85. As illustrated in FIG. 17, the cleaning portion 81 has a hollow cylindrical member whose top has formed therein an opening 81a which permits the insertion therethrough of the ferrule 713 mounted on the arm 711a of the head unit 7, and has an air nozzle 811 provided at the top thereof and has a jetting nozzle 812 provided in the interior thereof. The air nozzle 811 jets a pressurized air sent from a supply source of the plant air toward the forward end of the ferrule 713. On the other hand, the jetting nozzle 812 jets a liquid cleaner sent from a liquid cleaner tank 86 provided on the base 80, e.g., alcohol, toward the forward end of the ferrule 713. Here, the alcohol which has been jetted from the jetting nozzle 812 is recovered from a suction port not illustrated provided at a lower part of the cleaning portion 81.

The embedding portion 82 is a portion for embedding the solder into the fiber hole of the ferrule 713 and, as illustrated in FIGS. 14 to 16A and 18, is provided on the moving stage 85 and comprises a pedestal 821, a mounting member 824, a syringe 823, two slide guides 824, two retaining members 825, a driving member 826 and a saucer 827.

Figure 16A:
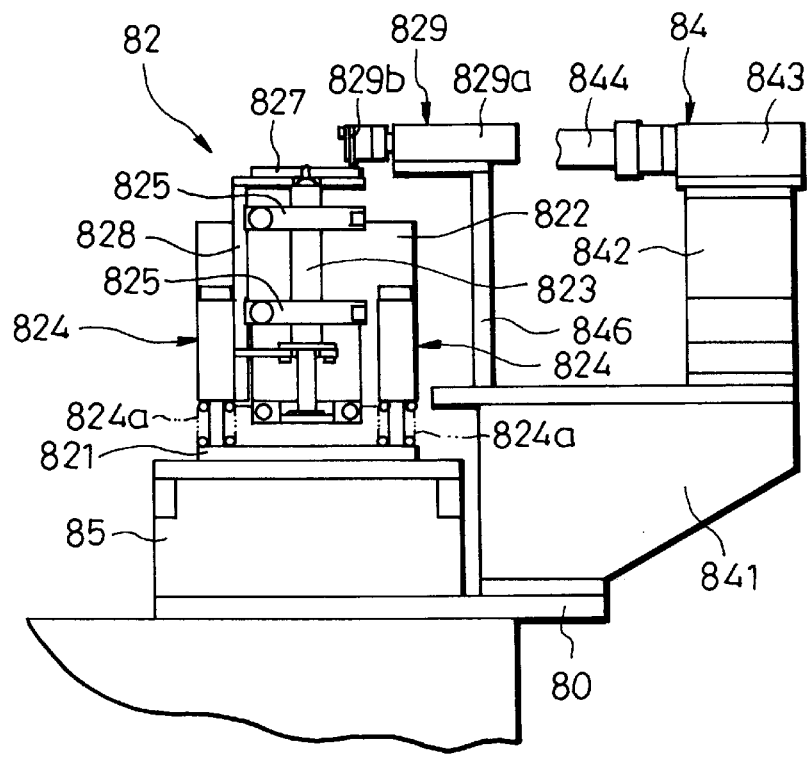
FIG. 16A is a side view illustrating an embedding portion for embedding solder and a monitoring portion for monitoring a state where solder is adhered, both provided in the supply unit of FIG. 14

As illustrated in FIG. 16A, the mounting member 822 is supported on the pedestal 821 by the respective slide guides 824 each having a stopper (not illustrated) in such a way that the mounting member 824 is vertically freely slidable, and is upwardly urged by springs 824a mounted on linear shafts of the respective slide guides 824.

Figure 18:
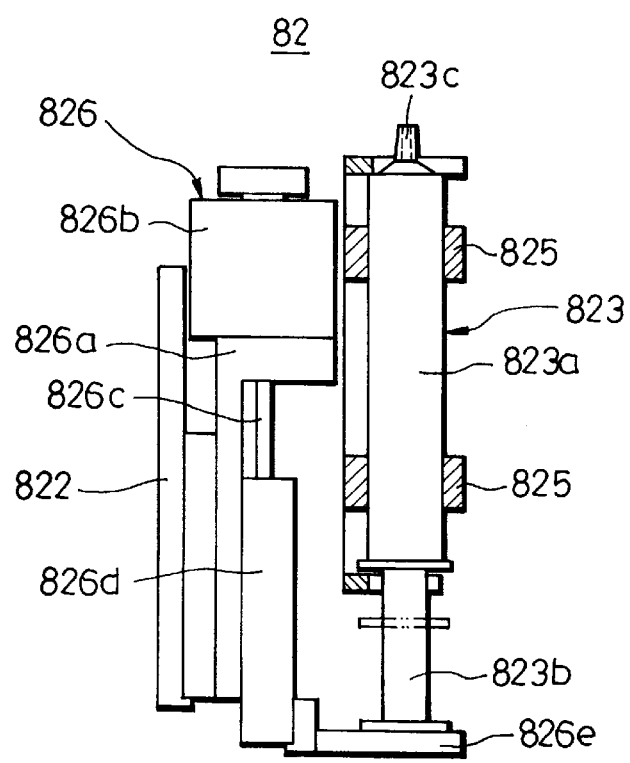
FIG. 18 is a rear surface view illustrating the solder embedding portion provided in the supply unit of FIG. 14.
Figure 19:
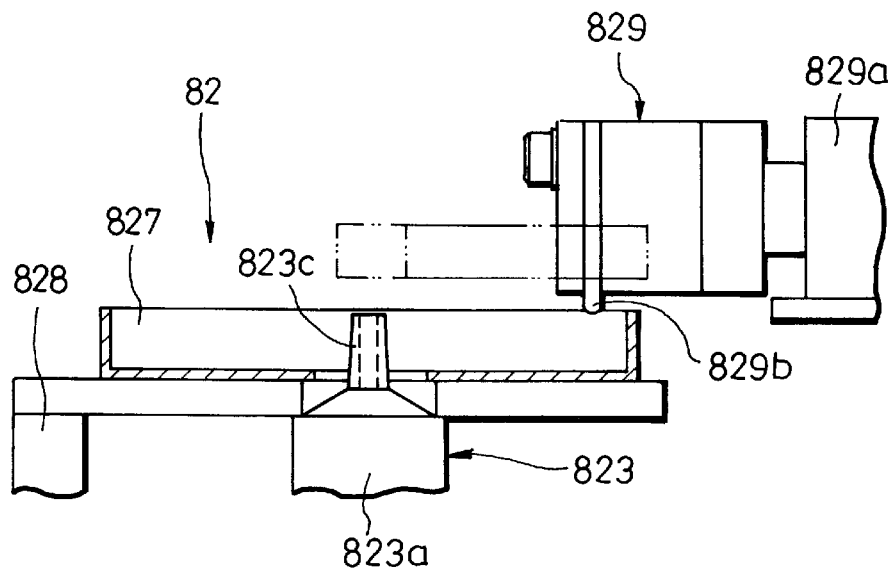
FIG. 19 is an enlarged view illustrating the side of a syringe tip provided in the solder embedding portion provided in the supply unit of FIG. 14 on an enlarged scale.

As illustrated in FIG. 18, the syringe 823 has a trunk portion 823a for accommodating the solder paste and a piston 823b and is retained by the respective retaining members 825 with a discharge port 823c thereof being directed upward. The retaining member 825 is mounted on a side plate 828 fixed to the mounting member 822 and has a V groove plate having a V groove and a retaining arm. The retaining member 825 positions trunk portion 823a by the V groove plate, thereby retaining the syringe 823.

As illustrated in FIG. 18, the driving member 826 is supported by a supporting member 822 and is arranged to press the piston 823b of the syringe 823 to thereby cause the solder paste to be discharged from the discharge port 823c. The driving member 826 is a member which is constructed as in the case of the first rise/fall stage 712 and comprises a supporting plate 826a, a main body 826b, a screw shaft 826c, a slider 826d which vertically moves and a pressing plate 826e.

The saucer 827 is a dish-like member for receiving the solder paste discharged from the discharge port 823c of the syringe 823. Here, the solder paste discharged from the discharge port 823c of the syringe 823 is scraped away by a scraper member 829 (see FIGS. 16A and 19) provided on a supporting column 846 of the monitoring portion 84 as later described.

Figure 20:
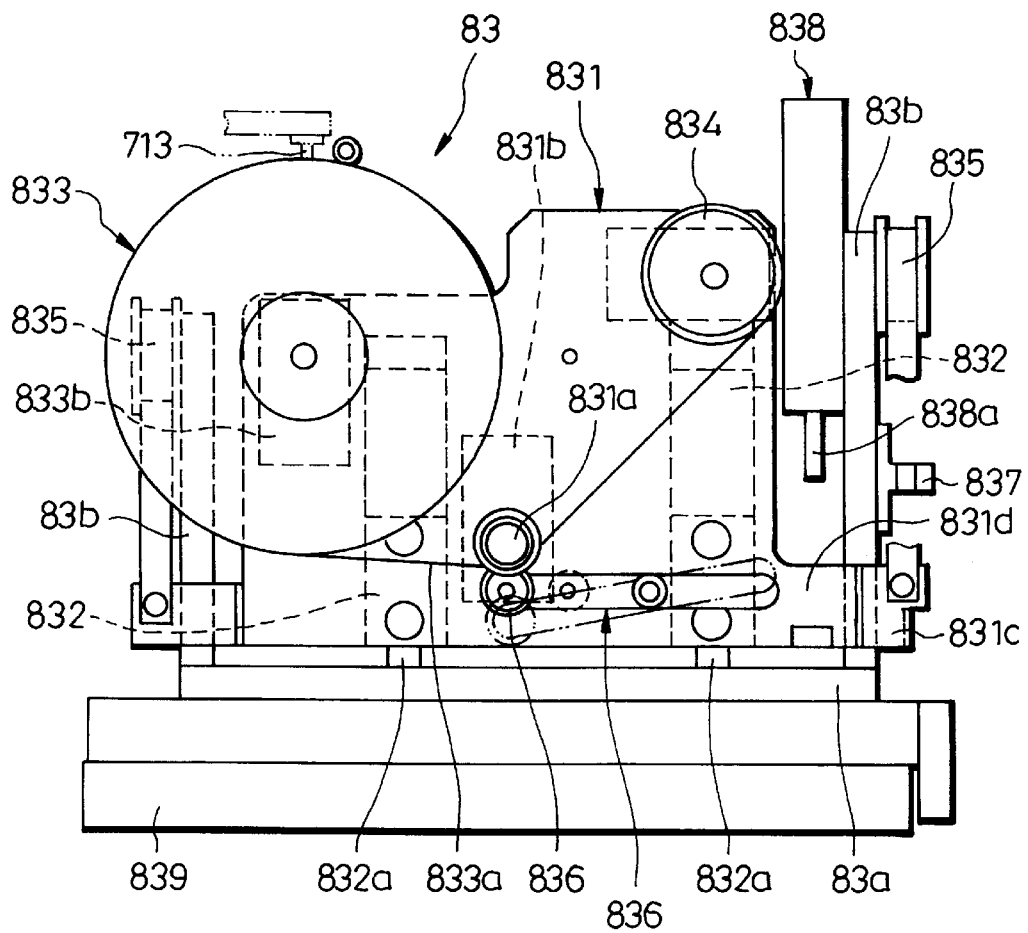
FIG. 20 is a front view illustrating a by-rubbing solder cutting portion provided in the supply unit of FIG. 14.
Figure 21:
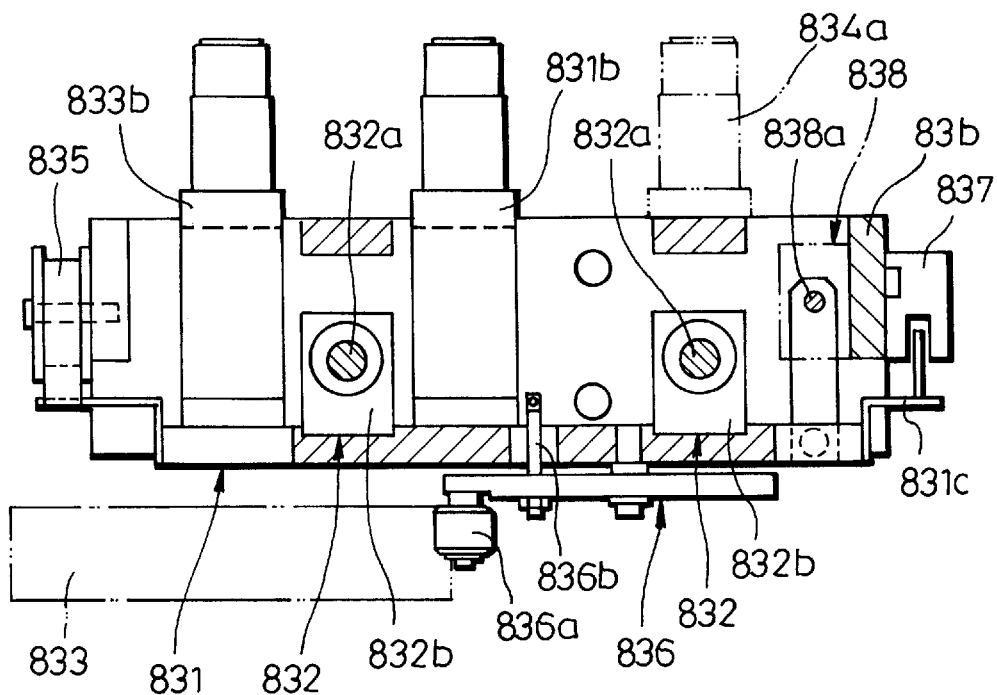
FIG. 21 is a plan view illustrating the by-rubbing solder cutting portion of FIG. 20 in section.
Figure 22:
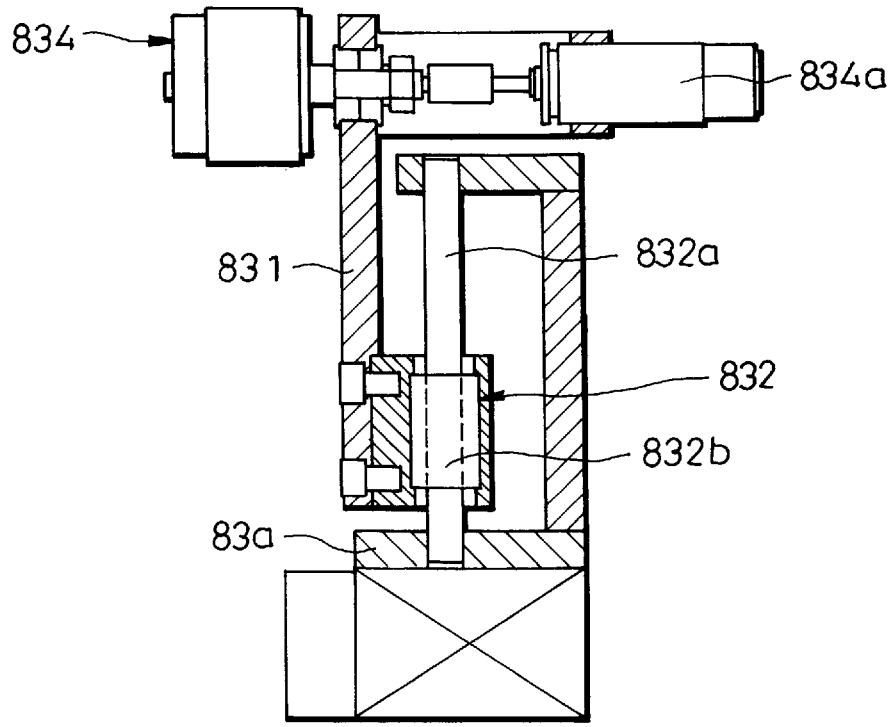
FIG. 22 is a side view illustrating the by-rubbing solder cutting portion of FIG. 20 in section.

The by-rubbing cutting portion 83 is a portion for by-rubbing cutting unnecessary solder forced out from the end surface of the ferrule 713 having had the solder embedded therein or adhered on the end surface thereof and wiping off such unnecessary solder, and, as illustrated in FIGS. 20 to 22, comprises a supporting plate 831, two slide guides 832, a by-rubbing cutting roll 833 and a take-up pulley 834.

The supporting plate 831 is supported by the two slide guides 832 provided on the pedestal 83a in such a way that the supporting plate 831 is vertically freely slidable. The supporting plate 831 is upwardly urged with a prescribed spring force by coil springs 835 provided on the top of two side plate 83b provided on both sides of the pedestal 83a. The supporting plate 831 has a timing pulley 831a rotatably supported on the front surface of a substantially central lower part thereof and has disposed on the back surface thereof a driving motor 831b for rotating the timing pulley 831a. Also, the supporting plate 831 has an arm 836 mounted on the front lower part thereof.

As illustrated in FIG. 21, the arm 836 is freely rockably mounted at its substantially central portion on the supporting member 831 and has a pinch roller 836a provided on its end portion on the timing pulley 831a side and has a pin 836b for having caught therein a spring (not illustrated) for urging the arm 836 so as for the pinch roller 836a to abut on the timing pulley 831a.

Also, the supporting plate 831 has mounted at one side thereof a detecting piece 831c for detecting the elevated position of the supporting plate 831 in cooperation with a photo-sensor 837 mounted on the side plate 83b. Here, the position of the upward movement of the supporting plate 831 is regulated by a stopper cylinder 838 provided on the side plate 83b. The stopper cylinder 838 has a shaft 838a whose forward end abuts on a regulating portion 831d provided on the side portion of the supporting plate 831.

As illustrated in FIG. 22, the slide guide 832 comprises a linear shaft 832a and a linear bush 832b mounted on the supporting plate 831.

As illustrated in FIG. 20, the by-rubbing cutting roll 833 is a roll which has wound therearound a by-rubbing cutting material 833a such as non-woven fabric and is rotatably disposed at the left upper portion of the supporting plate 831. The by-rubbing cutting material 833a is pinched between the timing pulley 831a and the pinch roller 836a and taken up onto a take-up pulley $^{834}$ at a fixed speed.

The take-up pulley 834 is disposed at the right upper portion of the supporting plate 831 and is driven to rotate by a motor 834a disposed at the back surface side thereof, whereby the slack of the by-rubbing cutting material 833a is wound and taken up.

Here, in FIG. 20, a reference numeral 839 denotes an air slide table.

Figure 16B:
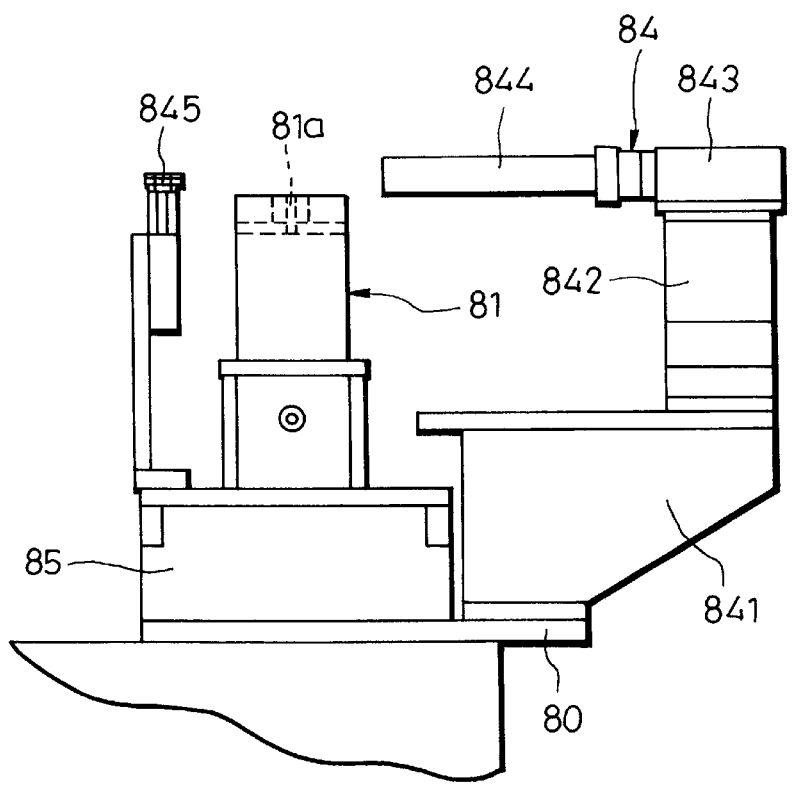
FIG. 16B is a side view illustrating a cleaning portion for cleaning solder and the monitoring portion.

The monitoring portion 84 is a portion for confirming the state of the solder which has been adhered onto the optical fiber 714 of the head unit 7 and, as illustrated in FIGS. 14, 15 and 16B, is disposed on a mounting base 841 provided on the base 80. The monitoring portion 84 has a CCD camera 843 provided on a supporting bracket 842 and a lens-barrel 844 mounted on this CCD camera 843. Here, on the moving stage 85 there is disposed a mirror 845 (see FIGS. 15 and 16) at a position opposing the lens-barrel 844. Also, the mounting base 841 has a supporting column 846 provided thereon, on which there is installed the scraper member 829. The scraper member 829 includes a compact slide 829a and a scraper 829b provided on a forward end side of an arm which expands and contracts due to the compact slide 829a.

The moving stage 85 is a stage which moves along the X-axial direction with the cleaning portion 81, embedding portion 82 and by-rubbing cutting portion 83 being placed thereon. Here, in FIGS. 14 and 15, a reference numeral 85a denotes a protecting material of a cable for supplying the power to driving means for driving the moving stage 85.

The bump forming apparatus 1 of this embodiment having the above-described construction forms a fine solder bump on the substrate $S_p$ in accordance with the solder bump forming method which will be described below.

First, in the bump forming apparatus 1, upon closure of the power source, an instruction signal for starting the pre-heating of the substrate is output from the controller 9 to the pre-heating portion 6. As a result of this, the pre-heating is started by the heater contained in the preheating plate 6a. Here, the temperature of the heater is controlled by the controller 9 so as to be maintained at a preset temperature according to the measured value of the temperature sensor installed in the heater.

Next, the substrate $S_p$ is conveyed in from the conveyance inlet of the housing 2 and is conveyed up to the pre-heating portion 6 by the conveyor 5. Then, the substrate $S_p$ which has been conveyed on is positioned by the positioning pin provided on the conveyor 5 and thereafter the pre-heating plate 6a rises to contact with the underside of the substrate $S_p$, whereby the preliminary heating is performed for 10 to 60 seconds.

The head unit 7 is moved to the supply unit 8 by means of the X-axis robot 3 and two Y-axis robots 4 while this preliminary heating is being performed. At this time, the X-axis robot 3 and Y-axis robots 4 are controlled by the controller 9 so that these robots do not operate unless it has been confirmed that in the head unit 7 the detecting piece 723b is detected by the photo-sensor 721a and so the rise/fall plate 711, accordingly the ferrule 713 is in the elevated position and accordingly no obstacle exists for the movement of the head unit 7.

When the head unit 7 is moved to the supply unit 8 and the ferrule 713 retained by the rise/fall plate 711 is thereby moved at the position right above the cleaning portion 81, the data on the solder amount needed to form the solder bump is transmitted from the controller 9 to the supply unit 8. As a result of this, the head unit 7 and the supply unit 8 start to operate in a preset sequential order while the head unit 7 and the supply unit 8 are being controlled by the controller 9.

That is, when the ferrule 713 retained by the rise/fall plate 711 is stopped at the position right above the opening 81a of the cleaning portion 81, the cleaning portion 81 of the supply portion 8 and the moving portion 72 of the head unit 7 start to operate.

And, in the head unit 7, the second rise/fall stage 722 of the moving portion 72 operates with the result that the rise/fall plate 711 of the main body portion 71 is lowered whereby the forward end of the ferrule 713 is inserted into the opening 81a of the cleaning portion 81. At this time, the forward end of the optical fiber 714 slightly protrudes from the forward end of the ferrule 713.

In the cleaning portion 81, alcohol is jetted from the jetting nozzle 812 toward the forward end of the ferrule 713, whereby the fiber hole and the optical fiber (both not illustrated) are cleaned. Upon completion of the cleaning, the second rise/fall stage 722 causes the rise/fall plate 711 to slightly rise to thereby draw out the ferrule 713 from the opening 81a. Subsequently, the pressurized air is jetted from the air nozzle 811 of the cleaning portion 81 toward the forward end of the ferrule 713, with the result that the alcohol which has theretofore remained to exist in the ambient area thereof is blown away, with the result that the cleaning of the ferrule 713 is completed. Upon completion of the cleaning, the second stage 722 causes the rise/fall plate 711 to be raised up to its initial level.

Next, the embedding of the solder into the fiber hole (not illustrated) of the ferrule 713 is executed as follows.

First, the moving stage 85 is moved in the X-axial direction and the embedding portion 82 is moved up to the position right beneath the ferrule 713 retained by the rise/fall plate 711 and is stopped there.

Next, the driving member 826 of the embedding portion 82 operates and then the piston 823b is pressed by the pressing plate 826e to thereby slightly extrude the solder paste from the discharge port 823c. Thereafter, the first rise/fall stage 712 of the head unit 7 operates to cause the optical fiber 714 to rise to thereby form a space of a prescribed size in the fiber hole of the ferrule 713.

Subsequently, the second rise/fall stage 722 of the head unit 7 operates to lower the rise/fall plate 711 and the end surface of the ferrule 713 retained thereby is thereby pressed onto the thus-extruded solder paste, whereby the solder paste is embedded into the fiber hole of the ferrule 713. Upon completion of the solder paste embedding, the second rise/fall stage 722 causes the rise/fall plate 711 to rise up to the initial elevated position and is stopped. At this time, the ferrule 713 has unnecessary solder paste adhered onto its end surface as well as onto its fiber hole.

Thereafter, the by-rubbing cutting portion 83 starts to operate, whereby the above-mentioned unnecessary solder paste having been adhered onto the end surface of the ferrule 713 is wiped away as follows by the by-rubbing cutting operation.

First, the moving stage 85 is moved in the X-axial direction until the by-rubbing cutting roll 833 of the by-rubbing cutting portion 83 is located at the position right beneath the ferrule 713.

Next, the second rise/fall stage 722 operates to lower the rise/fall plate 711 to thereby press the end surface of the ferrule 713 retained thereby against the by-rubbing cutting material 833a. In this state, the moving stage 85 is slightly moved further in the X-axial direction to thereby wipe away the unnecessary solder paste adhered onto the end surface of the ferrule 713 by the by-rubbing cutting material 833a as if by-rubbing cutting this unnecessary solder paste by this by-rubbing cutting material 833a. Upon completion of this by-rubbing cutting operation, the second rise/fall stage 722 causes the rise/fall plate 711 to rise up to the initial elevated position and is stopped.

Subsequently, in the head unit 7, the first rise/fall stage 712 operates to slightly lower the slider 712d by a distance somewhat larger than the distance corresponding to the amount of the solder paste embedded in the fiber hole of the ferrule 713. As a result of this, the optical fiber 714 fixed to the fixing plate 716 by the pressing plate 717 is lowered and is extruded 0.02 mm or so from the end surface of the ferrule 713. In accordance with this, the solder paste embedded in the fiber hole is extruded in a state of its being adhered on the optical fiber 714. This extruded solder paste is photographed by the CCD camera 843 of the monitoring portion 84 to thereby confirm an adhered state of solder paste such as the presence or absence of the solder paste, the amount of solder, etc. If this adhered state is excellent, transfer is made to the next step. However, if the adhered state is poor, the operation returns to the above-mentioned step for cleaning the forward end of the ferrule 713, whereupon the embedding step, by-rubbing cutting step, etc. are repeatedly executed.

When the adhered state of the solder paste adhered onto the optical fiber 714 is excellent, the head unit 7 is moved up to the substrate $S_p$ by the X-axis robot 3 and Y-axis robots 4 in a state where the solder paste has been extruded on the end surface of the ferrule 713.

Then, the rise/fall plate 711 is lowered by the second rise/fall stage 722 and then a prescribed amount of the solder paste adhered on the optical fiber 714 is caused to adhere onto a copper pad (not illustrated). Then, this solder is fused by the heating light which is sent on from the LD module 725 through the optical fiber 714 to thereby form a fine solder bump.

At this time, when the rise/fall plate 711 is lowered, first, the solder paste having adhered on the forward end of the optical fiber 714 contacts with the copper pad. And, when the rise/fall plate 711 is further lowered, the solder paste is appropriately squashed to such an extent as not to be severed and is thereby reliably adhered onto the copper pad, whereupon a resisting force equal to the contact pressure acts on the optical fiber 714 through the squashed solder paste.

Then, since the rise/fall plate 711 is supported by the moving portion 72 so that the rise/fall plate 711 may rise when the force corresponding to several grams or so acts on the moving portion 72 by the constant tension spring 724 and extension spring 727, the rise/fall plate 711 slightly rises due to the resisting force by the slider 715 being guided by the guide member 723.

With a rise of the rise/fall plate 711, the vertical relative position between the guide member 723 and the rise/fall plate 711. However, the vertical relative distance therebetween is calculated by a distance signal output from the sensor 73 to the controller 9.

And, the controller 9 causes the head unit 7 to be raised by the second rise/fall stage 722 by a distance obtained by adding a given offset distance to the calculated relative distance to thereby form a gap between the optical fiber 714 and the solder paste adhered onto the copper pad of the substrate $S_p$.

Here, the above-mentioned offset distance is set to be a distance which when forming the solder bump by heating and fusing the solder paste adhered from the optical fiber 714 onto the substrate $S_p$ prevents the fused solder and the forward end of the optical fiber 714 from interfering with each other and thereby distorting the configuration of the formed solder bump and in addition enables the solder to be sufficiently fused by the heating light from the LD module 725 which has been emitted from the optical fiber 714.

In a state where the gap has been formed in this way, the solder is sufficiently fused by the heating light from the LD module 725 to thereby form a fine solder bump on the copper pad of the substrate $S_p$. Since the substrate $S_p$ is preliminarily heated by the pre-heater 6 as mentioned above, the solder can be fused quickly with even a weak light.

As described above, according to the bump forming apparatus 1 of this embodiment, when forming a solder bump on the substrate $S_p$, it is possible to form a fine solder bump of a proper configuration at a desired position on the substrate $S_p$ while detecting the relative distance between the rise/fall plate 711 and the moving portion 72 by means of the sensor 73.

The substrate $S_p$ on which the solder bump has finished being formed as mentioned above is conveyed by the conveyor 5 up to the conveyance outlet and discharged, after which a new substrate $S_p$ is conveyed in from the conveyance inlet, whereby the above-mentioned solder bump forming operation is repeatedly performed while being controlled by controller 9.

Here, in the head unit 7, as described above, by suitably adjusting the amount of the optical fiber 714 inserted into the fiber hole of the ferrule 713, it is possible to set the amount of the solder embedded in the space formed between the fiber hole and the optical fiber 714 to be at a desired value. Therefore, when the amount of solder of the solder bump having been formed on the substrate $S_p$ is smaller than required, it is possible to add a desired amount of solder to this solder bump.

It is to be noted that although in the above-described embodiments the ferrule 713 is used as the die and the optical fiber 714 is used as the punch, a proper amount of solder may be adhered onto the substrate $S_p$ using a die and punch which are in conformity with the size of a desired solder bump.

Also, with regard to the heating source, the solder may be heated by heating the die (ferrule) through heat conduction, or may be non-contact heated using, for example, laser.

Further, although in each of the above-described embodiments an explanation has been given of the case where the single optical fiber is inserted into the through hole of the die, only if the solder bump of a proper configuration can be stably formed, a multi-fiber ferrule for a multi-fiber connector may needless to say be used as the die.

What is claimed is:

1. A solder bump forming method comprising:

causing an end surface of a punch inserted into a through hole provided in a die to be retracted by a desired distance from an end surface of the die to thereby provide a recess of a desired volume in the end surface of the die;

embedding solder paste in the recess;

moving the punch toward the end surface of the die to thereby extrude the solder paste;

retaining the punch by means of a retaining member, and moving the punch toward a substrate while resiliently supporting the retaining member so as to be movable in a direction away from the substrate by a force acting upon the punch through the solder paste; and fusing the solder paste extruded by the movement of the punch.

2. A solder bump forming method as set forth in claim 1, wherein the solder paste is fused by using a non-contact type heating light source.

3. A solder bump forming method as set forth in claim 1, wherein the punch comprises a light waveguide member which introduces heating light for fusing the solder paste from a first end surface of the light waveguide member.

4. A solder bump forming method as set forth in claim 1, further comprising a step of cleaning the punch prior to embedding the solder paste in the recess of the die.

5. A solder bump forming method as set forth in claim 1, further comprising a step of removing excess solder paste outside the recess at the end surface of the die.

6. A solder bump forming method as set forth in claim 3, wherein the heating light is introduced from the first end surface of the light waveguide member and radiated onto the solder paste at a second end surface of the light waveguide member to thereby fuse the solder paste and form a solder bump on the substrate.

7. A solder bump forming method as set forth in claim 6, wherein after the solder paste is fused by the heating light radiated onto the solder paste, the fused solder is brought into contact with a desired portion of the substrate to thereby form the solder bump on the desired portion of the substrate.

8. A solder bump forming method as set forth in claim 6, wherein the solder paste is adhered onto a pad of the substrate prior to introducing the heating light.

9. A solder bump forming method as set forth in claim 8, wherein after the solder paste is adhered onto the pad of the substrate and prior to introducing the heating light, the light waveguide member is separated from the pad to thereby cause the light waveguide member to be spaced away from the solder adhered onto the pad.

10. A solder bump forming method as set forth in claim 1, wherein the substrate is pre-heated in advance.

11. A solder bump forming method as set forth in claim 2, wherein the substrate is pre-heated in advance.

12. A solder bump forming method as set forth in claim 3, wherein the substrate is pre-heated in advance.

13. A solder bump forming method as set forth in claim 4, wherein the substrate is pre-heated in advance.

14. A solder bump forming method as set forth in claim 5, wherein the substrate is pre-heated in advance.

15. A solder bump forming method as set forth in claim 6, wherein the substrate is pre-heated in advance.

16. A solder bump forming method as set forth in claim 7, wherein the substrate is pre-heated in advance.

17. A solder bump forming method as set forth in claim 8, wherein the substrate is pre-heated in advance.

18. A solder bump forming method as set forth in claim 9, wherein the substrate is pre-heated in advance.

19. A soldering method using the solder bump forming method according to claim 1, wherein a head unit comprises:

a main body portion including said die, said punch, and said retaining member;

a moving portion which is movable in a direction of approach to the substrate, said retaining member being mounted on said moving portion such that the retaining member is freely movable along the direction of approach to the substrate; and a sensor for sensing a relative distance between the moving portion and the main body portion in the direction of approach to the substrate; and wherein said method comprises lowering the main body portion to cause the solder paste to adhere onto the substrate, and raising the moving portion by a distance corresponding to the distance measured by the sensor to thereby form a gap between the solder paste adhered onto the substrate and the main body portion.

20. A solder bump forming method as set forth in claim 1, wherein, prior to fusing the solder paste, the solder paste is adhered to a pad on the substrate and the punch is moved in a direction away from the pad.

21. A solder bump forming method as set forth in claim 11, wherein the punch is moved to a position such that the end surface thereof is separated from the fused solder.

22. A solder bump forming method as set forth in claim 1, wherein the end surface of the punch is held in contact with a surface of the fused solder on the substrate to thereby flatten an upper surface thereof.

* * * * *

UNITED STATES PATENT AND TRADEMARK OFFICE
CERTIFICATE OF CORRECTION

PATENT NO. : 6,053,398
DATED : April 25, 2000
INVENTOR(S) : Shinichiro IIZUKA et al.

It is certified that error appears in the above-indentified patent and that said Letters Patent is hereby corrected as shown below:

Item [54] Title, change the title
to --SOLDER BUMP FORMING METHOD AND SOLDERING METHOD USING SAME--;

Item [45] Date of Patent, delete "*";

Under Item [73] Assignee, delete
"[*] Notice: This patent issued on a continued prosecution application filed under 37 CFR 1.53(d), and is subject to the twenty year patent term provisions of 35 U.S.C. 154(a)(2)."

Signed and Sealed this

Twenty-second Day of May, 2001

*Attest:*

NICHOLAS P. GODICI

*Attesting Officer*   Acting Director of the United States Patent and Trademark Office